(12) United States Patent
Zhang et al.

(10) Patent No.: US 10,276,746 B1
(45) Date of Patent: Apr. 30, 2019

(54) POLARIZATION ELECTRIC FIELD ASSISTED HOLE SUPPLIER AND P-TYPE CONTACT STRUCTURE, LIGHT EMITTING DEVICE AND PHOTODETECTOR USING THE SAME

(71) Applicant: BOLB INC., San Jose, CA (US)

(72) Inventors: Jianping Zhang, San Jose, CA (US); Ying Gao, San Jose, CA (US); Ling Zhou, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 15/813,082

(22) Filed: Nov. 14, 2017

Related U.S. Application Data

(60) Provisional application No. 62/574,083, filed on Oct. 18, 2017.

(51) Int. Cl.
| | |
|---|---|
| H01L 33/04 | (2010.01) |
| H01L 33/14 | (2010.01) |
| H01L 33/06 | (2010.01) |
| H01L 33/16 | (2010.01) |
| H01L 31/103 | (2006.01) |
| H01L 33/32 | (2010.01) |
| H01L 33/40 | (2010.01) |
| H01L 33/46 | (2010.01) |
| H01L 31/0304 | (2006.01) |
| H01L 33/22 | (2010.01) |

(52) U.S. Cl.
CPC ........ *H01L 33/14* (2013.01); *H01L 31/03048* (2013.01); *H01L 31/1035* (2013.01); *H01L 33/06* (2013.01); *H01L 33/145* (2013.01); *H01L 33/16* (2013.01); *H01L 33/22* (2013.01); *H01L 33/325* (2013.01); *H01L 33/40* (2013.01); *H01L 33/46* (2013.01)

(58) Field of Classification Search
CPC ....... H01L 33/06; H01L 33/32; H01L 33/007; H01L 33/0075; H01L 33/0025; H01S 5/125; H01S 5/3211; B82Y 20/00
See application file for complete search history.

(56) References Cited

U.S. PATENT DOCUMENTS

| | | | |
|---|---|---|---|
| 5,831,277 A | 11/1998 | Razeghi | 257/15 |
| 6,104,039 A | 8/2000 | Asatsuma et al. | 257/22 |

(Continued)

OTHER PUBLICATIONS

E. F. Schubert et al., "Enhancement of deep acceptor activation in semiconductors by superlattice doping" Applies Physics Letters; vol. 69, Issue 24; Dec. 9, 1996; pp. 3737-3739.

(Continued)

*Primary Examiner* — Caridad Everhart
(74) *Attorney, Agent, or Firm* — J.C. Patents

(57) ABSTRACT

A hole supplier and p-contact structure for a light emitting device or a photodetector includes a p-type group III nitride structure and a hole supplier and p-contact layer made of Al-containing group III nitride formed on the p-type group III nitride structure and being under a biaxial in-plane tensile strain, the hole supplier and p-contact layer has a thickness in the range of 0.6-10 nm, and the p-type group III nitride structure is formed over an active region of the light emitting device or photodetector. A light emitting device and a photodetector with a hole supplier and p-contact structure.

27 Claims, 18 Drawing Sheets

(56) References Cited

U.S. PATENT DOCUMENTS

| | | | |
|---|---|---|---|
| 8,426,225 B2 | 4/2013 | Shatalov et al. ............... 438/22 |
| 2013/0032835 A1* | 2/2013 | Shatalov ............... H01L 33/20 |
| | | | 257/94 |
| 2014/0138618 A1* | 5/2014 | Wu .................. H01L 33/14 |
| | | | 257/13 |
| 2017/0117438 A1* | 4/2017 | Shur .................. H01L 33/06 |
| 2017/0263814 A1* | 9/2017 | Lin .................. H01L 33/14 |

OTHER PUBLICATIONS

Edward T. Yu et al., "Spontaneous and piezoelectric polarization in nitride heterostructures" Book Chapter for inclusion in III-V Nitride Semiconductors: Applications and Devices; vol. 16; Published by Taylor & Francis Books, Inc.

J. P. Zhang et al., "Milliwatt power deep ultraviolet light-emitting diodes over sapphire with emission at 278nm" Applies Physics Letters; vol. 81, No. 26; Dec. 23, 2002; pp. 4910-4912.

\* cited by examiner

POLARIZATION ELECTRIC FIELD ASSISTED HOLE SUPPLIER AND P-TYPE CONTACT STRUCTURE, LIGHT EMITTING DEVICE AND PHOTODETECTOR USING THE SAME

CROSS-REFERENCE TO RELATED APPLICATION

This application claims priority of U.S. provisional application No. 62/574,083, filed on Oct. 18, 2017, entitled "POLARIZATION ELECTRIC FIELD ASSISTED TRANSPARENT HOLE SUPPLIER AND P-TYPE CONTACT STRUCTURE AND LIGHT EMITTING DEVICE USING THE SAME", which is hereby incorporated by reference in its entirety.

FIELD OF THE INVENTION

The present invention relates in general to semiconductor light emitting technology and, more particularly, to a polarization electric field assisted hole supplier and p-type contact structure for a light emitting device or a photodetector, and to light emitting devices and photodetectors with a polarization electric field assisted hole supplier and p-type contact structure.

DESCRIPTION OF THE RELATED ART

Nitride compound semiconductors such as InN, GaN, AlN, and their ternary and quaternary alloys depending on alloy compositionenable ultraviolet (UV) emissions ranging from 410 nm approximately to 200 nm. These include UVA (400-315 nm), UVB (315-280 nm), and part of UVC (280-200 nm) emissions. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity and dosage, facilitating an ideal disinfection/sterilization treatment for water, air, food and object surface. Further, the light output of nitride UV light emitterscan be modulated at high frequencies up to a few hundreds of mega-hertz, promising them to be innovative light sources for Internet of Things, covert communications and bio-chemical detections.

The state of the art UV light-emitting diodes (LEDs) commonly adopt a laminate structure containing a c-plane sapphire as UV transparent substrate, an AlN layer coated over the substrate serving as epitaxy template, and a set of AlN/AlGaN superlattice for dislocation and strain management. The utilization of AlN template and AlN/AlGaN superlattice enables growth of high-quality high-conductivity n-type AlGaN electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type GaN or InGaN layer for ohmic contact formation. A conventional AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

Wide-band-gap semiconductors such as AlGaN materials have acceptor activation energy ($E_A$) increasing with band-gap width ($E_g$). $E_A$ limits hole concentration (p) according to equation:

$$p = \sqrt{\frac{1}{g}N_A N_V}\, e^{-\frac{E_A}{2KT}},$$

where g is the acceptor degeneracy (g=2), $N_A$ is the acceptor concentration, $N_V$ is the effective density of states at the valence band edge, K is Boltzmann constant, and T is the absolute temperature ("Enhancement of deep acceptor activation in semiconductors by superlattice doping", E. F. Schubert, W. Grieshaber and I. d. Goepfert, Appl. Phys. Lett. 69, 9 (1996)). For $N_A=10^{20}$ cm$^{-3}$ and $E_A=200$ meV (for the case of Mg in GaN and $N_V$ (300K)=$4.62\times10^{19}$ cm$^{-3}$), the equation calculates about 1% of the acceptors being ionized at room temperature, meaning that free holes in the valence band have a concentration of $1\times10^{18}$ cm$^{-3}$, barely suitable for hole supplier and p-type ohmic contact. For $N_A=10^{20}$ cm$^{-3}$ and $E_A=500$ meV (for the case of Mg in AlN and $N_V$ (300K)=$4.88\times10^{20}$ cm$^{-3}$), the room-temperature acceptor activation ratio as estimated would only be $9.86\times10^{-5}$. For a general $Al_xGa_{1-x}N$ material, the acceptor ionization energy lies between 200-500 meV (linearly increasing with Al-composition x). So, for UVB/UVC transparent $Al_xGa_{1-x}N$ materials (1≥x≥0.26), hole concentration would be too low for hole supply and p-type ohmic contact formation. In view of this obstacle, p-type GaN or InGaN layer is commonly used as hole supplier layer and p-ohmic contact layer in conventional UV LEDs. However, the strong UV absorption (coefficient ~$10^5$ cm$^{-1}$) of p-type GaN and InGaN layers severely limits UV LEDs' light extraction efficiency (LEE) to be as small as 3%-6%.

Superlattice structures containing p-type AlGaN barrier layers and p-type GaN well layers have been proposed to replace conventional p-type AlGaN layers for improved conductivity and preserved UV transparency (e.g. U.S. Pat. Nos. 5,831,277, 6,104,039, and 8,426,225, the contents of which are incorporated herein by reference in their entirety). The valence band and polarization discontinuities between AlGaN and GaN will lead to hole accumulation within the GaN wells. Holes can move freely within the GaN well planes. However, the AlGaN/GaN valence band and polarization discontinuities will impede hole movement in the directions perpendicular to the GaN well plane. This is to say, that p-type AlGaN/GaN superlattice can have improved lateral conductivity yet with limited vertical conductivity, not suitable for vertical hole injection into the MQW active-region for light emissions. To enhance vertical conductivity of p-AlGaN/GaN superlattice, thickness of the p-AlGaN barrier layer within the superlattice can be estimated according to hole's Bohr radius as the rule of thumb:

$$a_B = \frac{4\pi\varepsilon_r\varepsilon_0\hbar^2}{m_h e^2} = \frac{m_0}{m_h}\varepsilon_r a_{B0} = 0.529\frac{m_0}{m_h}\varepsilon_r(\text{Å})$$

since hole's effective mass $m_h$ in AlGaN is very heavy, close to or larger than that of the free electron mass, $m_0$, and the relative permittivity $\varepsilon_r$ of AlGaN material is in-between of 8 to 9 depending on Al-composition, hole's Bohr radius within AlGaN is approximately around 5 Å. When applying such a thin AlGaN layer in the AlGaN/GaN superlattice, a) if the GaN well layer is thick enough to maintain a good AlGaN/GaN interface, the superlattice will be UV opaque; b) if the GaN well layer also maintains the ultrathin thickness for UV transparency, the ultrathin AlGaN/GaN superlattice interface will be vanishing because of interface roughness and composition mixing, which turns the ultrathin-period AlGaN/GaN superlattice identically to a conventional AlGaN alloy, losing all the hole accumulation benefit.

SUMMARY OF THE INVENTION

Embodiments of the present invention disclose a hole supplier and p-type contact structure, particularly an UV transparent hole supplier and p-type contact structure, for light emitting devices or photodetectors, particularly UV light emitting devices and UV photodetectors. The hole supplier and p-type contact structure according to embodiments of the present invention has improved current-voltage characteristics and light extraction efficiency.

One aspect of the present invention provides a hole supplier and p-contact structure for a light emitting device or a photodetector.

The hole supplier and p-contact structure includes:
a p-type group III nitride structure; and
a hole supplier and p-contact layer made of Al-containing group III nitride formed on the p-type group III nitride structure and being under a biaxial in-plane tensile strain,
wherein the hole supplier and p-contact layer has a thickness in the range of 0.6-10 nm, and the p-type group III nitride structure is formed over an active region of the light emitting device or photodetector.

The room-temperature acceptor activation ratio of the hole supplier and p-contact layer can be larger than 1%.

The acceptor activation energy of the hole supplier and p-contact layer can be in the range of 0.1 to 0.5 eV, and a polarization induced electric field in the hole supplier and p-contact layer is in the range of $3 \times 10^5$ V/cm to $3 \times 10^7$ V/cm.

The hole supplier and p-contact layer can be made of $Al_xGa_{1-x}N$ with $0.7 \leq x \leq 1$.

The hole supplier and p-contact layer can be made of AlN and coherently formed on the p-type group III nitride structure.

The hole supplier and p-contact layer can have an Al-composition higher than that of the p-type group III nitride structure.

The hole supplier and p-contact layer can be doped with Mg in a concentration of $1.0 \times 10^{20}$ cm$^{-3}$ to $1.0 \times 10^{21}$ cm$^{-3}$.

The hole supplier and p-contact layer can form an ohmic contact with a low-work-function metal.

The hole supplier and p-contact layer can form an ohmic contact with as-deposited metals of work functions larger than 5.2 eV, such as Pd (Palladium), Pt (Platinum), and Os (Osmium) et al.

The light emitting device can be a light emitting diode, or a laser diode.

Another aspect of the present invention provides a light emitting diode.

The light emitting diode includes:
an n-type AlGaN structure;
a p-type AlGaN structure;
a multiple quantum well active-region sandwiched between the n-type AlGaN structure and the p-type AlGaN structure; and a hole supplier and p-contact layer made of Al-containing group III nitride formed on the p-type AlGaN structure,
wherein the hole supplier and p-contact layer has a higher Al-composition than that of the p-type AlGaN structure, the multiple quantum well active-region, and the n-type AlGaN structure, and is of a thickness from 0.6 nm to 10 nm.

The hole supplier and p-contact layer can be made of c-plane $Al_xGa_{1-x}N$ with $0.7 \leq x \leq 1$.

The hole supplier and p-contact layer can be doped with Mg in a concentration of $1.0 \times 10^{20}$ cm$^{-3}$ to $1.0 \times 10^{21}$ cm$^{-3}$.

The p-type AlGaN structure includes:
a hole injecting and electron blocking layer in contact with the multiple quantum well active-region;
a first channel layer formed on the hole injecting and electron blocking layer;
a p-type barrier formed on first channel layer; and
a second channel layer formed on p-type barrier,
wherein the hole supplier and p-contact layer is formed on the second channel layer.

The first and second channel layers can be made of p-type $Al_yGa_{1-y}N$ with $0 \leq y \leq 0.1$, respectively, and can be of a thickness in the range of 0.5-1.5 nm, respectively.

The p-type barrier can be made of p-type AlN and can be of a thickness in the range of 1-3 nm.

The p-type AlGaN structure includes multiple pairs of the p-type barrier and the first channel layer alternately stacked.

The hole injecting and electron blocking layer can be a p-type AlGaN layer, or a p-type AlGaN superlattice structure, or a p-type AlGaN multilayer structure.

The light emitting diode further includes a p-ohmic contact formed on the hole supplier and p-contact layer which forms ohmic contact with the hole supplier and p-contact layer.

The p-ohmic contact can be made of Ni, Au, Pd, Pt, Rh, Os, or W layer, or a combination thereof.

The light emitting diode further includes a transparent dielectric layer formed on the hole supplier and p-contact layer side-by-side with the p-ohmic contact.

A portion of the multiple quantum well active-region, the p-type AlGaN structure, the hole supplier and p-contact layer, and the p-ohmic contact can be removed to form a depression exposing then-type AlGaN structure, and an n-ohmic contact is disposed in the depression in contact with then-type AlGaN structure.

The n-type AlGaN structure includes:
an n-type AlGaN current spreading layer;
a heavily doped n-type AlGaN screening layer; and
a lightly doped n-type AlGaN layer,
wherein the lightly doped n-type AlGaN layer is in contact with the multiple quantum well active-region, the heavily doped n-type AlGaN screening layer is sandwiched between the n-type AlGaN current spreading layer and the lightly doped n-type AlGaN layer.

The n-type AlGaN current spreading layer can be of a thickness in the range of 2-5 micron and with dopant of $2.0 \times 10^{18}$-$5.0 \times 10^{18}$ cm$^{-3}$.

The heavily doped n-type AlGaN screening layer can be of a thickness in the range of 0.2-0.5 micron and with dopant of $8.0 \times 10^{18}$-$2.0 \times 10^{19}$ cm$^{-3}$.

The lightly doped n-type AlGaN layer can be of a thickness in the range of 0.1-0.5 micron and with dopant of $2.5 \times 10^{17}$-$2.0 \times 10^{18}$ cm$^{-3}$.

Another aspect of the present invention provides a UV photodetector.

The UV photodetector includes:
an n-type AlGaN structure;
a p-type AlGaN structure;

a light absorbing layer sandwiched between the n-type AlGaN structure and the p-type AlGaN structure; and
a hole supplier and p-contact layer made of Al-containing group III nitride formed on the p-type AlGaN structure,
wherein the hole supplier and p-contact layer has a thickness from 0.6 nm to 10 nm.

The hole supplier and p-contact layer can be made of $Al_xGa_{1-x}N$ with $0.7 \leq x \leq 1$.

The hole supplier and p-contact layer can be doped with Mg in a concentration of $1.0 \times 10^{20}$ $cm^{-3}$ to $1.0 \times 10^{21}$ $cm^{-3}$.

The p-type AlGaN structure includes:
a hole injecting and electron blocking layer in contact with the light absorbing layer active-region;
a first channel layer formed on the hole injecting and electron blocking layer;
a p-type barrier formed on first channel layer; and
a second channel layer formed on p-type barrier,
wherein the hole supplier and p-contact layer is formed on the second channel layer.

The first and second channel layers can be made of p-type $Al_yGa_{1-y}N$ with $0 \leq y \leq 0.1$, respectively, and can be of a thickness in the range of 0.5-1.5 nm, respectively.

The p-type barrier can be made of p-type AlN and can be of a thickness in the range of 1-3 nm.

The p-type AlGaN structure can include multiple pairs of the p-type barrier and the first channel layer alternately stacked.

The hole injecting and electron blocking layer can be a p-type AlGaN layer, or a p-type AlGaN superlattice structure, or a p-type AlGaN multilayer structure.

The n-type AlGaN structure includes:
an n-type AlGaN current spreading layer;
a heavily doped n-type AlGaN screening layer; and
a lightly doped n-type AlGaN layer,
wherein the lightly doped n-type AlGaN layer is in contact with the light absorbing layer, the heavily doped n-type AlGaN screening layer is sandwiched between the n-type AlGaN current spreading layer and the lightly doped n-type AlGaN layer.

The n-type AlGaN current spreading layer can be of a thickness in the range of 2-5 micron and with dosage of $2.0 \times 10^{18}$-$5.0 \times 10^{18}$ $cm^{-3}$.

The heavily doped n-type AlGaN screening layer can be of a thickness in the range of 0.2-0.5 micron and with dosage of $8.0 \times 10^{18}$-$2.0 \times 10^{19}$ $cm^{-3}$.

The lightly doped n-type AlGaN layer can be of a thickness in the range of 0.1-0.5 micron and with dosage of $2.5 \times 10^{17}$-$2.0 \times 10^{18}$ $cm^{-}$

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N, Al_xIn_yGa_zZr_{(1-x-y-z)}N, Al_xIn_yGa_zHf_{(1-x-y-z)}N$, with $(1-x-y-z) \leq 10\%$.

As well known, light emitting devices such as light emitting diodes (LEDs) and laser diodes, commonly adopt a laminate structure containing a quantum well active region, an n-type group III nitride structure for injecting electrons into the active region, and a p-type group III nitride structure on the other side of the active region for injecting holes into the active region.

The hole supplier and p-contact structure for a light emitting device according to embodiments of the present invention includes a p-type group III nitride structure, such as an UV transparent p-type structure, and a hole supplier and p-contact layer made of Al-containing group III nitride formed on the p-type group III nitride structure and being under a biaxial in-plane tensile strain. The hole supplier and p-contact layer also can be used in photodetectors such as UV photodetectors.

The hole supplier and p-contact layer can be UV transparent with an Al-composition in the range of 0.26-1 and, at least in some embodiments, can form ohmic contact with both high-work-function metals and low-work-function metals. The hole supplier and p-contact layer may have a thickness in the range of 0.6-10 nm.

The p-type group III nitride structure can be a p-type structure used in conventional light emitting devices such as UV LEDs and UV laser diodes, or the like. In the following contents, wurtzite c-plane nitride light-emitting devices or structures are used as examples to elucidate the principle and spirit of the present invention. The teachings in this specification and given by the following embodiments can be applied to non-c-plane nitride semiconductors, II-VI semiconductors and other semiconductor devices.

Figure 1:
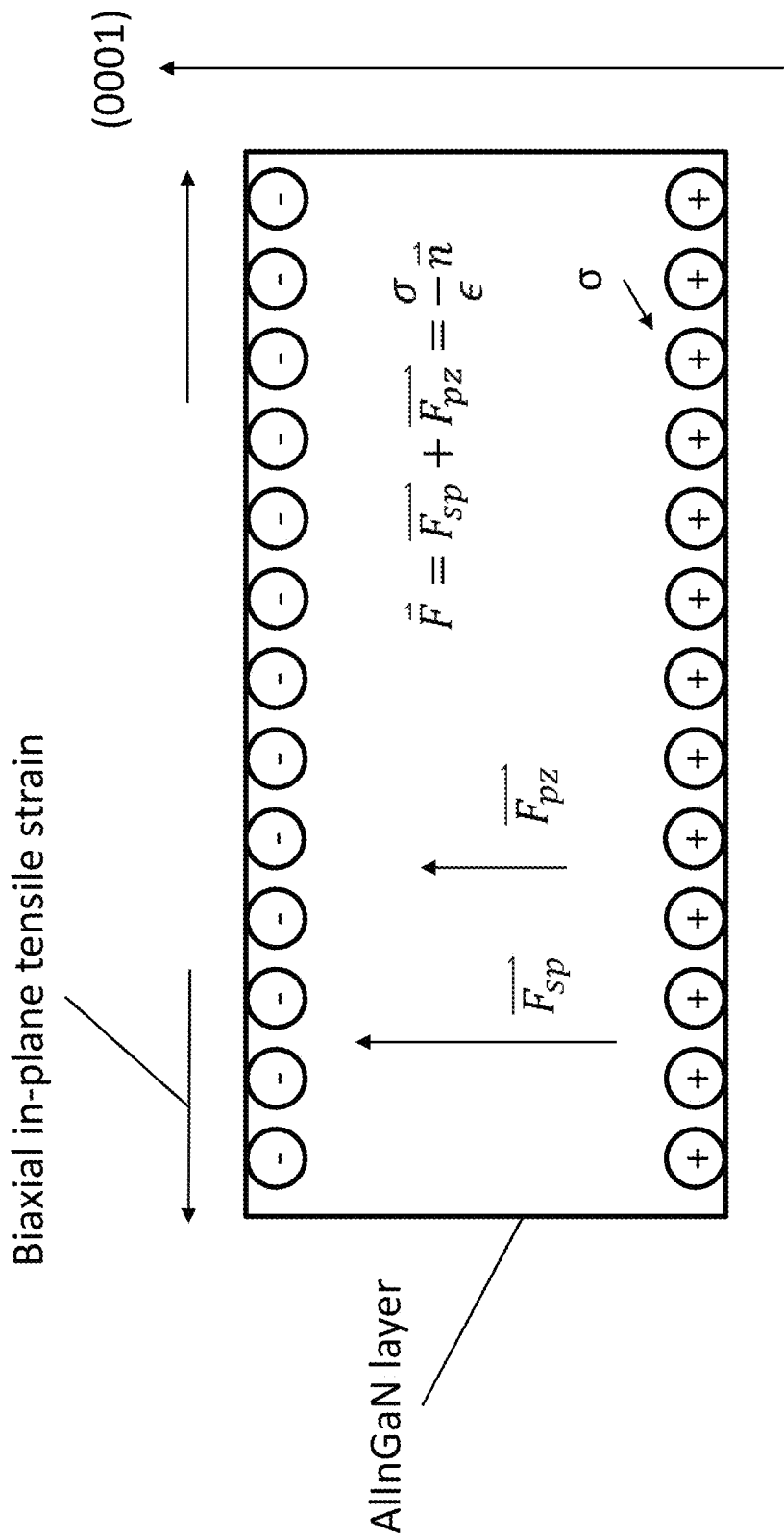
FIG. 1 illustrates polarization induced surface charges and electric field of a (0001)-oriented AlInGaN layer.

Illustration in FIG. 1 shows polarization induced surface charges and electric field of a c-plane ((0001)-oriented, or c-oriented) AlInGaN layer. A polar semiconductor possesses spontaneous polarization, and piezoelectric polarization as well if strained. A review on AlInGaN polarization parameters and properties can be found in literature, for example, in "Spontaneous and piezoelectric polarization in nitride heterostructures" (by E. T. Yu, chapter 4, III-V Nitride Semiconductors: Applications and Devices, edited E. T. Yu and O. Manasreh, published in 2003 by Taylor & Francis). As shown in FIG. 1, for a (0001)-oriented AlInGaN layer, spontaneous polarization will induce negative and positive surface charges in (0001) and (000$\bar{1}$) surfaces, respectively. If the layer is under biaxial in-plane tensile strain, the resultant piezoelectric polarization ($P_{pz}$) will reinforce the spontaneous polarization ($P_{sp}$). Piezoelectric polarization relates to biaxial in-plane strain ($\varepsilon$) via equation:

$$P_{pz} = 2\left(e_{31} - \frac{c_{13}}{c_{33}}e_{33}\right)\varepsilon,$$

where $e_{ij}$ and $c_{ij}$ are the coefficients of piezoelectric and elastic tensors, respectively, and $$\varepsilon = \frac{a_{sub} - a_{epi}}{a_{epi}},$$

with $a_{sub}$ and $a_{epi}$ being respectively the relaxed substrate and epilayer lattice constants. As seen, for biaxial in-plane tensile strain ($\varepsilon > 0$), piezoelectric polarization constructively contributes to spontaneous polarization, while for biaxial in-plane compressive strain ($\varepsilon < 0$), piezoelectric polarization is against spontaneous polarization. Polarization (P) relates to surface charge density ($\sigma$) according to equation: $\vec{P} \cdot \vec{n} = (\vec{P}_{sp} + \vec{P}_{sp}) \cdot \vec{n} = -\sigma$, where $\vec{n}$ is surface normal. And for a large slab of semiconductor layer, surface charge induced electric field (F) can be calculated by $$F = \frac{\sigma}{\epsilon},$$

where $\epsilon$ is permittivity.

For example, if a thin AlN layer is coherently (fully strained) formed over a thick, relaxed $Al_xGa_{1-x}N$ template layer, there will be electric field within the thin AlN layer, constructively contributed from the AlN layer's spontaneous and piezoelectric polarizations. Using the parameters and method explained above, FIG. 2A plots the polarization electric field in the thin AlN layer, as function of Al-composition (x) of the fully relaxed (0001)-oriented $Al_xGa_{1-x}N$ template layer. The electric field points along c-direction (see FIG. 1), and reaches a maximal value of $1.6 \times 10^7$ V/cm when the template layer is made of GaN (however, if the template layer is made of InGaN, the electric field will continue to increase with In-composition, because of the increasing biaxial in-plane strain and piezoelectric polarization).

Figure 2A:
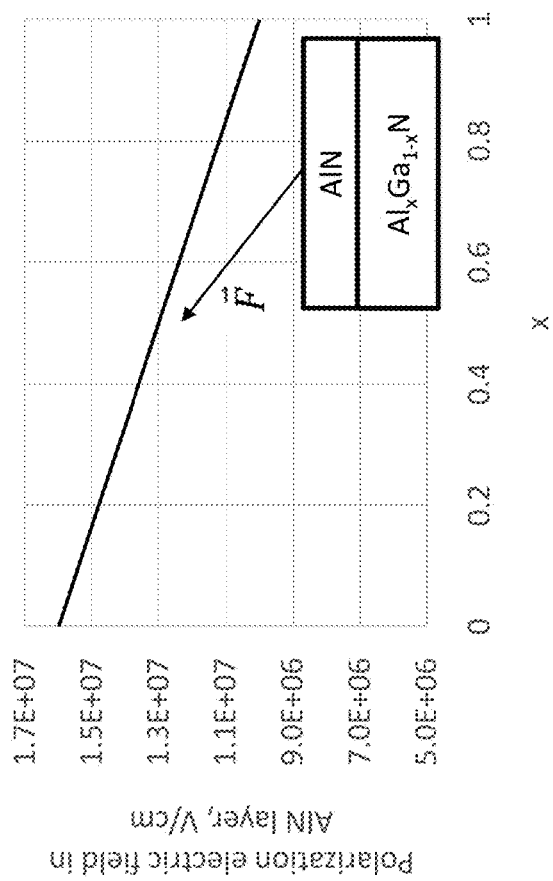
FIG. 2A plots polarization electric field as function of Al-composition (x) within a coherently strained AlN layer formed over a fully relaxed (0001)-oriented $Al_xGa_{1-x}N$ layer.
Figure 2B:
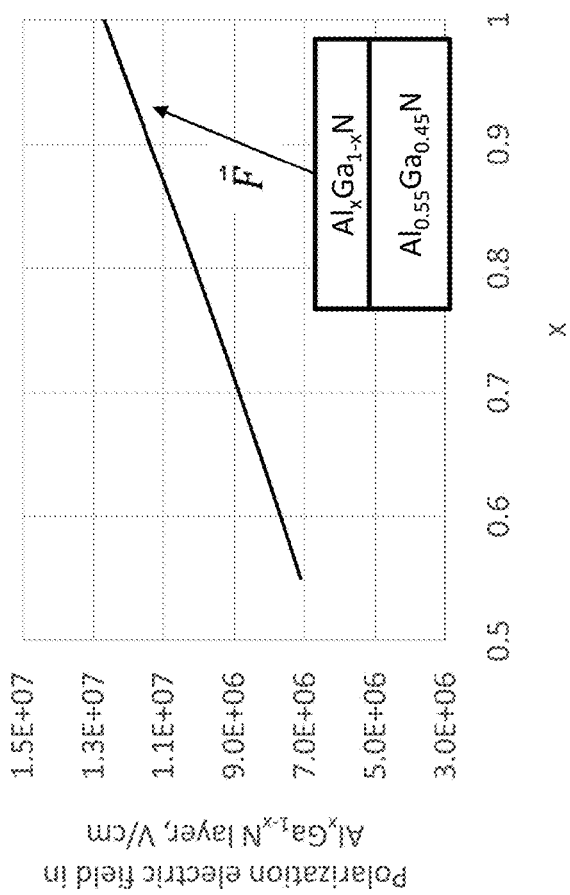
FIG. 2B plots polarization electric field as function of Al-composition (x) within a coherently strained $Al_xGa_{1-x}N$ layer formed over a fully relaxed (0001)-oriented $Al_{0.55}Ga_{0.45}N$ layer.

In FIG. 2B the epitaxial template layer is fixed with Al-composition at 55% (mostly used for 270-280 nm UV LEDs), and the thin epitaxial layer has different Al-composition x. As seen, the electric field within the thin coherent $Al_xGa_{1-x}N$ epitaxial layer increases linearly with x, and reaches a maximal value of $1.27 \times 10^7$ V/cm.

FIGS. 2A and 2B reveal huge electric field, in the range of $10^6$ V/cm to $10^7$ V/cm (or 0.1 V/nm to 1V/nm), presenting in thin coherent c-oriented AlGaN layers, pointing along c-direction. According to the present invention, this huge electric field can be utilized to form UV transparent hole supplier and p-type contact layer. The principle is illustrated in FIG. 3 and explained as follows.

Figure 3:
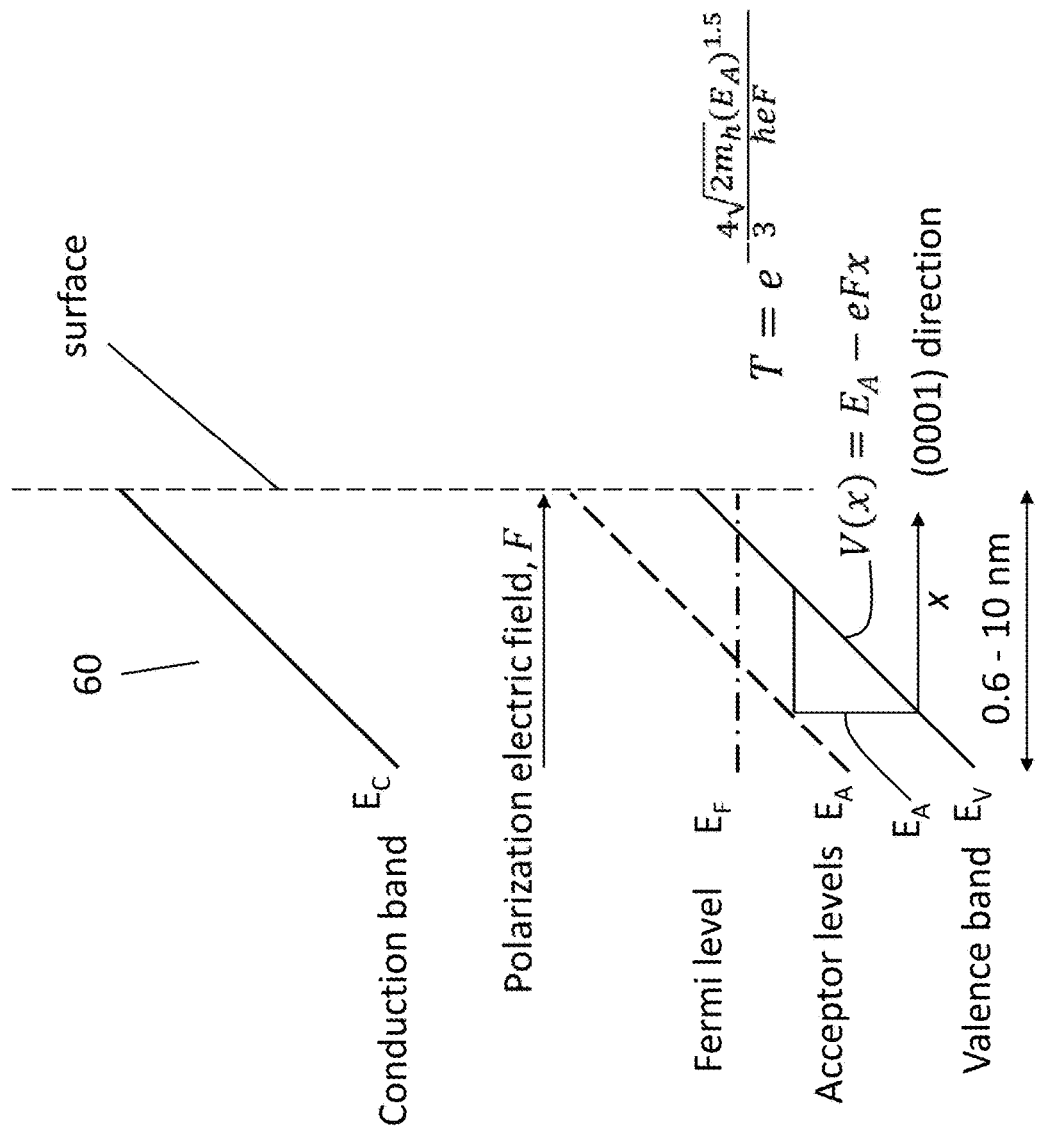
FIG. 3 illustrates the principle of an acceptor-bounded hole tunneling to valence band with the assistant of polarization electric field.

A hole supplier and p-contact layer 60 group III nitride according to an embodiment of the present invention is under polarization electric field F, as shown in FIG. 3, its valence and conduction band edges thus being tilted by the electric field F. Holes bounded to acceptors in layer 60 now feel a reduced potential barrier to activate/ionize. As explained previously, if there is no electric field to tilt the band edges, acceptors with large activation energy such as 500 meV will have a very small probability such as no more than $10^{-4}$ to ionize at room-temperature. The polarization electric field reduces the activation energy barrier from its original constant barrier $E_A$ to a triangular barrier V(x), and $V(x) = E_A - eFx$, where e is the electron elementary charge, and x is the distance to the acceptor along the F-direction (c-direction too). The tunneling probability (T) for a hole to tunnel through such a triangular barrier to valence band is given by the Fowler-Nordheim equation:

$$T = e^{-\frac{4}{3}\frac{\sqrt{2m_h}(E_A)^{1.5}}{\hbar eF}},$$

where $m_h$ and $\hbar$ are hole's effective mass and reduced Planck constant, respectively.

Figure 4:
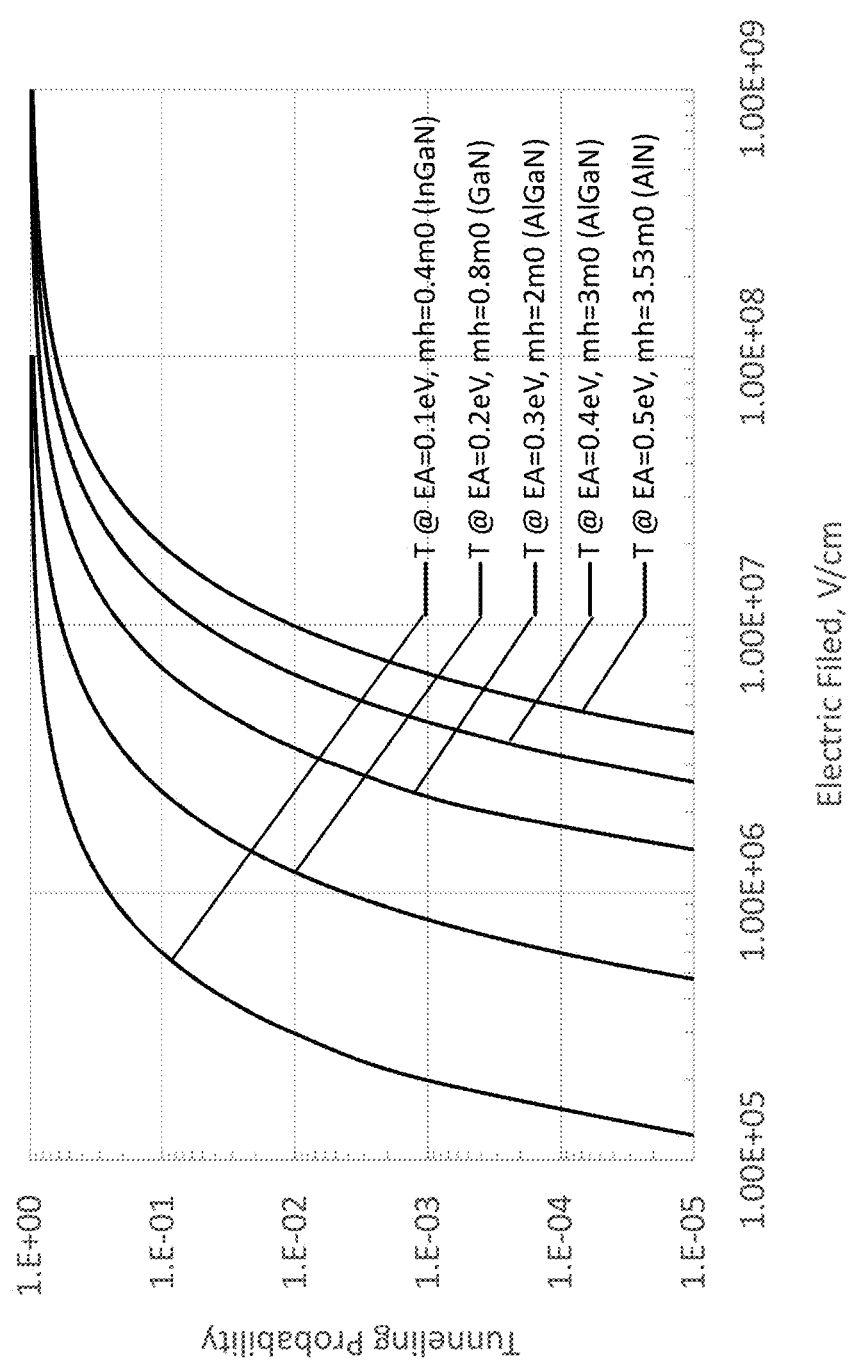
FIG. 4 plots the hole tunneling probability to valence band from acceptors of different acceptor activation energy (0.1-0.5 eV) with the assistant of different electric field strength.

As seen, for a given $E_A$, the presence of electric field F greatly enhances hole's tunneling (activation) probability. For acceptors in InGaN, GaN, AlGaN and AlN, the activation energy ($E_A$) and the hole effective mass ($m_h$) increases with bandgap width, making hole activation increasingly difficult, hence requiring increasingly large electric field to assist hole to tunnel. In FIG. 4, the electric field assisted tunneling probabilities of holes with some exemplary activation energy ($E_A$) and effective mass ($m_h$) are plotted against the electric field strength. These examples include the cases for acceptors in InGaN ($E_A$=0.1 eV, $m_h$=0.4 $m_0$), GaN ($E_A$=0.2 eV, $m_h$=0.8 $m_0$), AlGaN ($E_A$=0.3 eV, $m_h$=2 $m_0$, and $E_A$=0.4 eV, $m_h$=3 $m_0$), and AlN ($E_A$=0.5 eV, $m_h$=3.53$m_0$), where $m_0$ is electron's mass in free space. As seen, the required electric field strengths to achieve 1% tunneling probability for these InGaN, GaN, AlGaN, AlGaN, and AlN exemplary layers are respectively $3.0 \times 10^5$, $1.2 \times 10^6$, $3.5 \times 10^6$, $7.0 \times 10^6$, and $1.0 \times 10^7$ V/cm. If acceptor concentration ($N_A$) equals to $10^{20}$ cm$^{-3}$, 1% tunneling probability means hole concentration of $10^{18}$ cm$^{-3}$. The required electric field strengths to achieve 10% tunneling probability for these InGaN, GaN, AlGaN, AlGaN, and AlN exemplary layers are respectively $6.0 \times 10^5$, $2.4 \times 10^6$, $7.0 \times 10^6$, $1.3 \times 10^7$, and $2.0 \times 10^7$ V/cm. If acceptor concentration ($N_A$) equals to $10^{20}$ cm$^{-3}$, 10% tunneling probability means hole concentration of $10^{19}$ cm$^{-3}$. If the electric field is above $1.0 \times 10^8$ V/cm, nearly 100% of the acceptors can be activated at room temperature, regardless of the epilayer being InGaN, GaN, AlGaN, or even AlN.

AlInGaN materials have strong spontaneous and piezoelectric polarizations. The plots in FIGS. 2A and 2B show that it is common for a high Al-composition AlGaN layer or AlN layer to possess polarization electric field in the range of high $10^6$ to low $10^7$ V/cm. For the case of coherent thin AlN layer over relaxed thick $Al_{0.55}Ga_{0.45}N$ layer, FIG. 2B reveals a polarization electric field up to $1.27 \times 10^7$ V/cm. If the AlN layer is properly doped with acceptor (Mg) to a concentration of $2 \times 10^{20}$ cm$^{-3}$, the electric field assisted activation probability of 3% shown in FIG. 4 would result in a hole concentration of $6 \times 10^{18}$ cm$^{-3}$! This high-hole-concentration layer is thus ideal for UV LED's transparent hole supplier layer, according to the present invention. Further, referring back to FIG. 3, the activated holes will be swept by the electric field to layer 60's top surface, making Fermi level ($E_F$) penetrate into valence band at the surface vicinity and producing surface degenerate two-dimensional hole gas (2DHG). The surface high-density 2DHG can form good ohmic contact to many metals, not only to high-work-function metals like Nickel (Ni), tungsten (W), Palladium (Pd), Platinum (Pt), Iridium (Ir), Osmium (Os), Rhodium (Rh) and Gold (Au), but also to some low-work-function metals like UV reflective metal Aluminum (Al) and visible light reflective Silver (Ag), In this specification, high work-function means that the work function is larger than 5.0 eV, and low work-function means that the work function is less than 5.0 eV. As such, the so designed layer 60 is an ideal transparent hole supplier layer and p-type contact layer.

Figure 5:
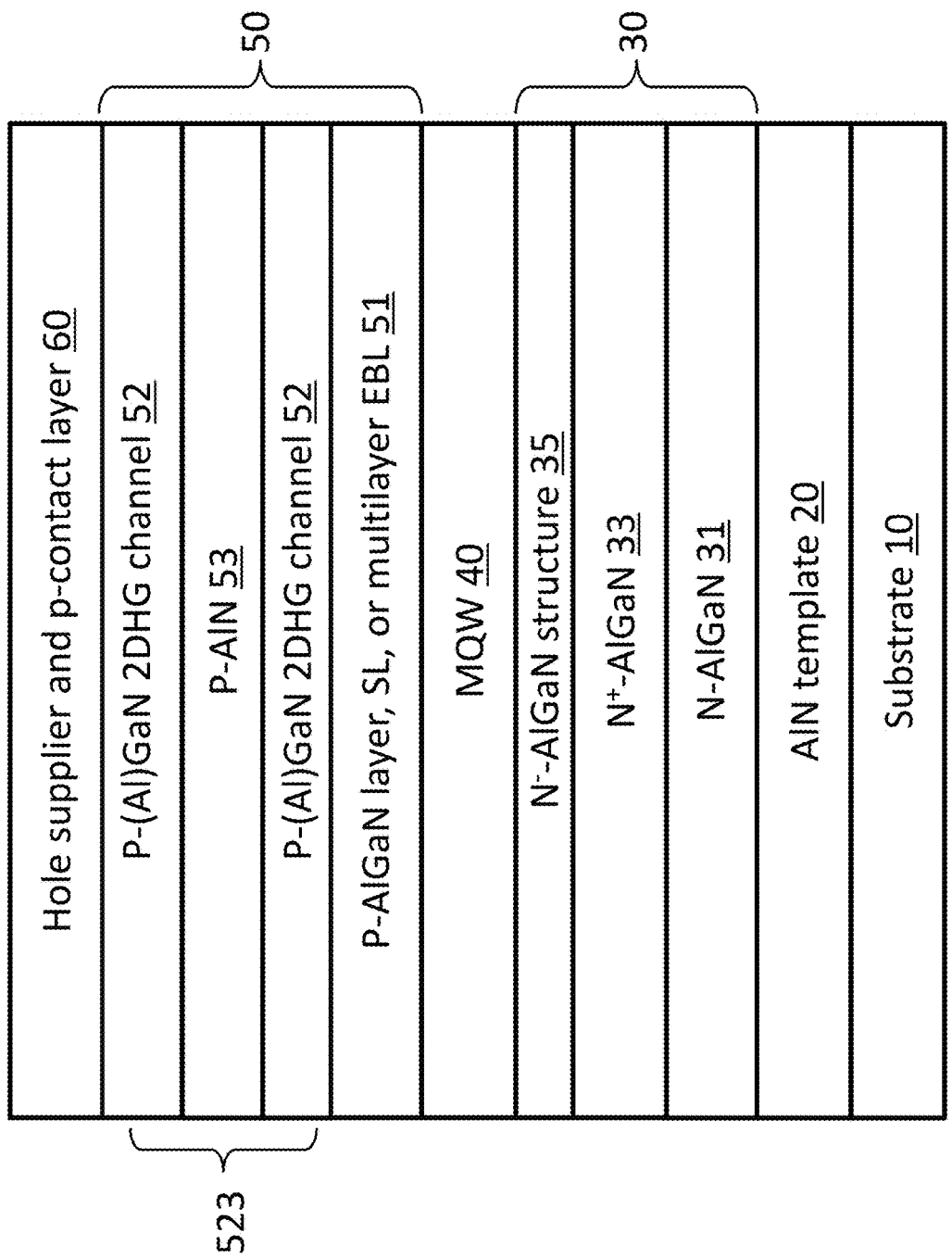
FIG. 5 illustrates a UV LED epitaxial layered structure according to an embodiment of the present invention.

Illustrated in FIG. 5 is the cross-sectional schematic view of a UV LED structure according to the present invention. The structure starts with a UV transparent substrate 10. Substrate 10 can be selected from sapphire, AlN, SiC, and the like. Formed over substrate 10 is a template 20, which can be made of a thick AlN layer, for example, with a thickness of 0.3-4.0 µm. Even though not shown in FIG. 5, a strain management structure such as an Al-composition grading AlGaN layer or sets of AlN/AlGaN super lattices can be formed over template 20. Formed over template 20 is a thick n-AlGaN structure 30 for electron supply and n-type ohmic contact formation. Structure 30 may include a thick (2.0-5.0 µm such as 3.0 µm, n=$2.0 \times 10^{18}$-$5.0 \times 10^{18}$ cm$^{-3}$) n-type N—AlGaN layer 31 for current spreading, a heavily n-type doped (0.2-0.5 µm such as 0.30 µm, n=$8 \times 10^{18}$-$2 \times 10^{19}$ cm$^{-3}$) N+—AlGaN layer 33 for MQW active-region polarization field screening, and a lightly doped N$^-$—AlGaN layer 35 (0.1-0.5 µm such as 0.15 µm, n=$2.5 \times 10^{17}$-$2 \times 10^{18}$ cm$^{-3}$) to reduce current crowding and prepare uniform current injection into the following $Al_bGa_{1-b}N$/$Al_wGa_{1-w}N$ MQW active-region 40. MQW 40 is made of alternatingly stacked n-$Al_bGa_{1-b}N$ barrier and $Al_wGa_{1-w}N$ well for a few times, for example, for 3-8 times. The barrier thickness is in the range of 8-16 nm, and the well thickness is 2-5 nm. The total thickness of MQW 40 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0, and 0.0-0.85, respectively, and the Al-composition difference of the barrier and well is at least 0.15, or so to ensure a barrier-well bandgap width difference ($\Delta E_g$) at least 400 meV to secure quantum confinement effect. Following MQW 40 is a p-type AlGaN structure 50. The part of structure 50 in contact with MQW active-region 40 is a p-AlGaN layer or a p-AlGaN superlattice structure, or a p-AlGaN multilayer structure serving as hole injecting and electron blocking layer (EBL) 51. Following EBL 51 is a hole spreading structure 523 including a p-type Mg-doped AlGaN or GaN channel 52 and a p-type AlN barrier 53. Barrier 53 and channel 52 form a two-dimensional hole gas in channel 52 for lateral current spreading. The Al composition in channel 52 can be small, or vanishing, for example, the Al composition can be in the range of 0 to 0.1 (10%), or 0 to 0.05 (5%). And the thicknesses of barrier 53 and channel 52 can be 1-3 nm and 0.5-1.5 nm, respectively. Further, barrier 53 and channel 52 can be alternatively formed for a few times, for example, 1-8 times, or 3-7 times, but always with a layer of channel 52 contacting EBL 51 and another layer of channel 52 contacting a hole supplier and p-contact layer 60. The total thickness of p-type AlGaN structure 50 is usually less than 100 nm, for example, being 50 nm, or 70 nm.

P-type AlGaN structure 50 and hole supplier and p-contact layer 60 formed thereon constitute a hole supplier and p-contact structure.

Hole supplier and p-contact layer 60 is designed according to the principle previously explained. Layer 60 can be heavily doped with Mg, to a concentration above $10^{20}$ cm$^{-3}$, for example from $1.0 \times 10^{20}$ cm$^{-3}$ to $1.0 \times 10^{21}$ cm$^{-3}$, or from $2.0 \times 10^{20}$ cm$^{-3}$ to $6.0 \times 10^{20}$ cm$^{-3}$. For UVB/UVC LEDs (emissions from 200 nm-315 nm), layer 60 is preferably to have a polarization electric field larger than $9.0 \times 10^6$ V/cm, which means, according to FIG. 2B, that layer 60 prefers to be a Mg-doped AlGaN layer with Al-composition larger than 0.7, or with Al-composition to be from 0.7 to 1.0. In other words, to take the advantage of AlInGaN's spontaneous and piezoelectric polarizations, layer 60 is preferred to have Al-composition equal to or higher than those of hole injecting and electron blocking layer (EBL) 51, channel 52 and barrier 53 of p-AlGaN structure 50, n-$Al_bGa_{1-b}N$ barrier and $Al_wGa_{1-w}N$ well of MQW 40, and the thick n-type N—AlGaN layer 31, the heavily n-type doped N+—AlGaN layer 33, and the lightly doped N$^-$—AlGaN layer 35 of N—AlGaN structure 30. This Al-composition selection of layer 60 automatically makes layer 60 transparent to emissions from MQW active-region 40.

Further, in highly efficient UV LEDs, N—AlGaN structure 30 because of its large thickness sets the epitaxial lattice constant template, and the relatively thin layers atop such as MQW 40 and p-AlGaN structure 50 are epitaxially and coherently formed on N—AlGaN structure 30 without in-plane lattice constant relaxation and dislocation-generation, or at least without significant in-plane lattice constant relaxation and dislocation-generation. In some embodiments of the present invention, layer 60 because of its thin thickness (0.6-10 nm) prefers to be fully strained according to the in-plane lattice constant of N—AlGaN structure 30 to take the advantage of piezoelectric polarization.

Another factor that affects the performance of layer 60 is its thickness. Referring back to FIG. 3, the activated holes are swept by polarization electric field to (0001) surface, leading to hole accumulation at the surface vicinity and depletion in the bulk region away from the surface vicinity. The hole accumulation and depletion can be seen from the separation of Fermi level to valence band ($E_F$–$E_v$), since $$p = N_V e^{\frac{-(E_F - E_V)}{kT}}.$$

The depleted bulk region will be highly resistive. If the thickness of the depletion region is too thick, upon applied positive bias holes cannot be easily injected into p-type AlGaN structure 50. According to some embodiments of the present invention, the thickness of layer 60 is limited to a certain level so that layer 60 will be conductive enough for sufficient hole injection, for example, the thickness of layer 60 can be in the range from 0.6 to 10 nm, or from 1.0 to 6.0 nm, or from 1.0 to 3.0 nm.

P-type AlGaN structure 50 can be of a structure other than that shown in FIG. 5. Further, if MQW active-region 40 emits longer wavelength emissions, for example UVA emissions (315 nm-400 nm), or visible emissions, other than UVB/UVC emissions, layer 60 can have less Al-composition. The design concept to form a proper hole supplier and p-type contact layer 60 is to firstly determine acceptor energy ($E_A$) in layer 60, then determine required polarization electric field to assist the acceptor to activate with desired probability, then select the proper composition for layer 60, as taught above and exemplified in FIGS. 2A, 2B and FIG. 4. The bandgap width (or Al-composition for the case of AlGaN) of layer 60 is preferred to be equal to or larger than those of p-AlGaN structure 50, MQW active-region 40, and N—AlGaN structure 30, for the sake of transparency as well as advantage of the constructive contribution of piezoelectric polarization to spontaneous polarization.

Figure 6A:
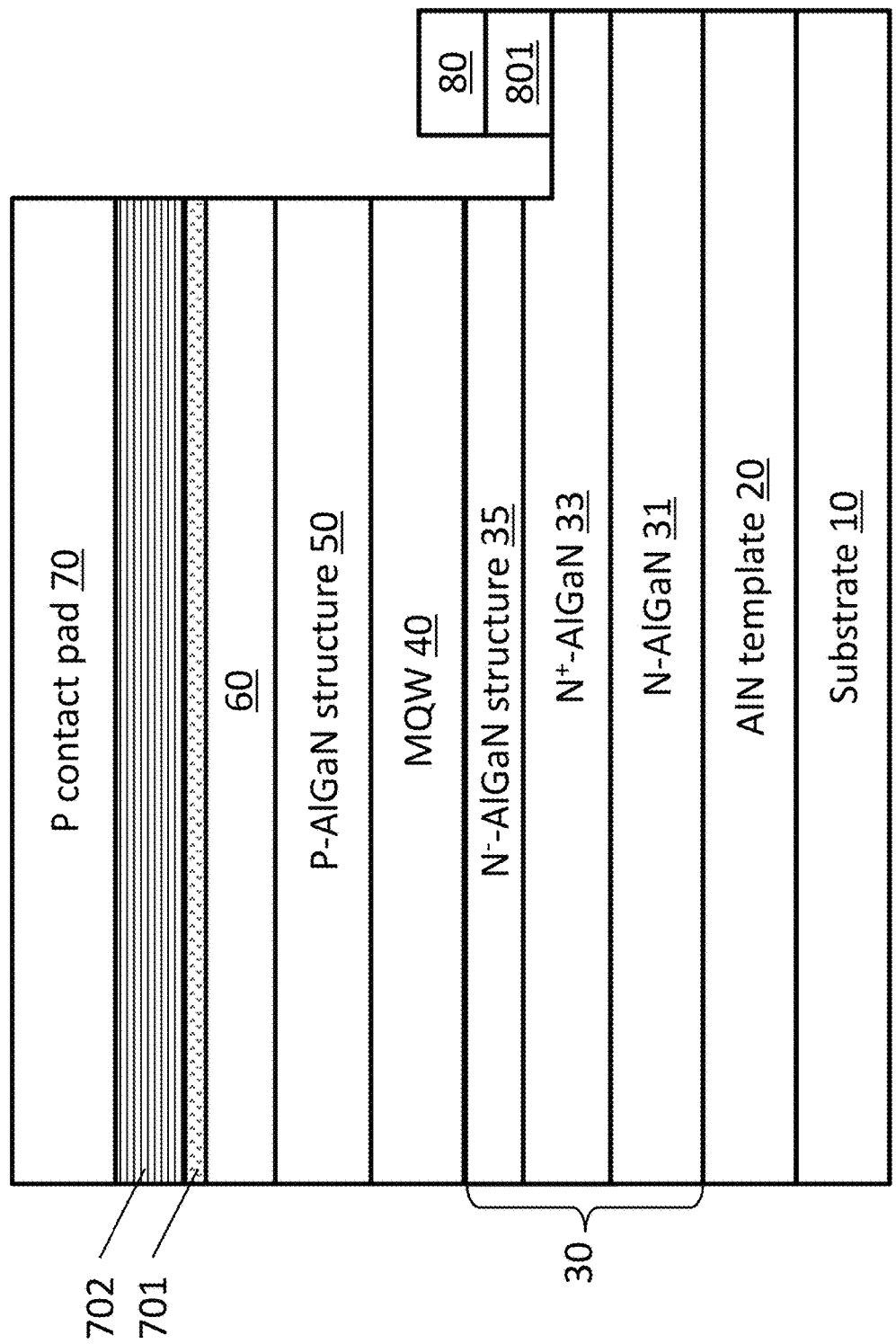
FIG. 6A illustrates the cross-sectional view of a UV LED according to an embodiment of the present invention.
Figure 6B:
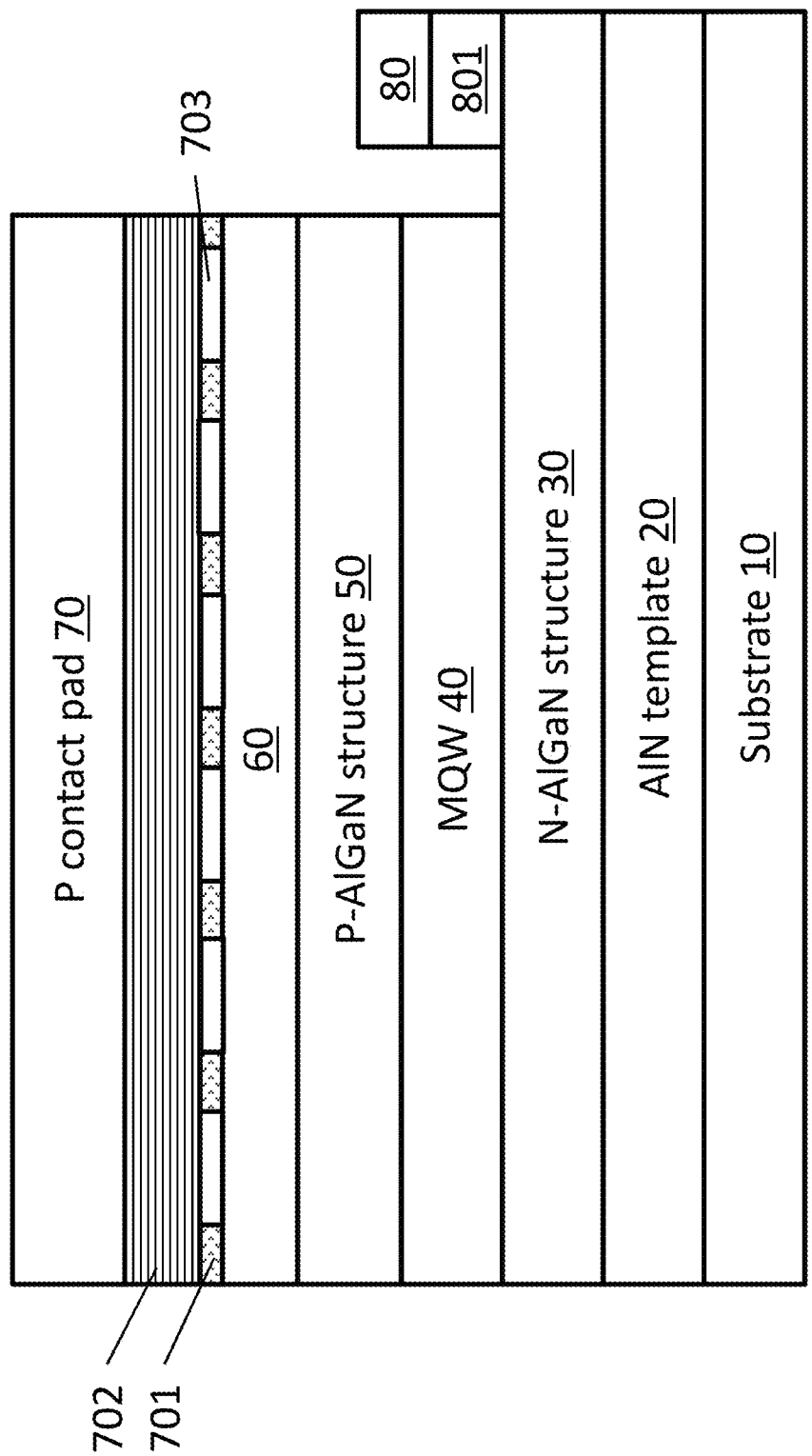
FIG. 6B illustrates the cross-sectional view of a UV LED according to an embodiment of the present invention.
Figure 7:
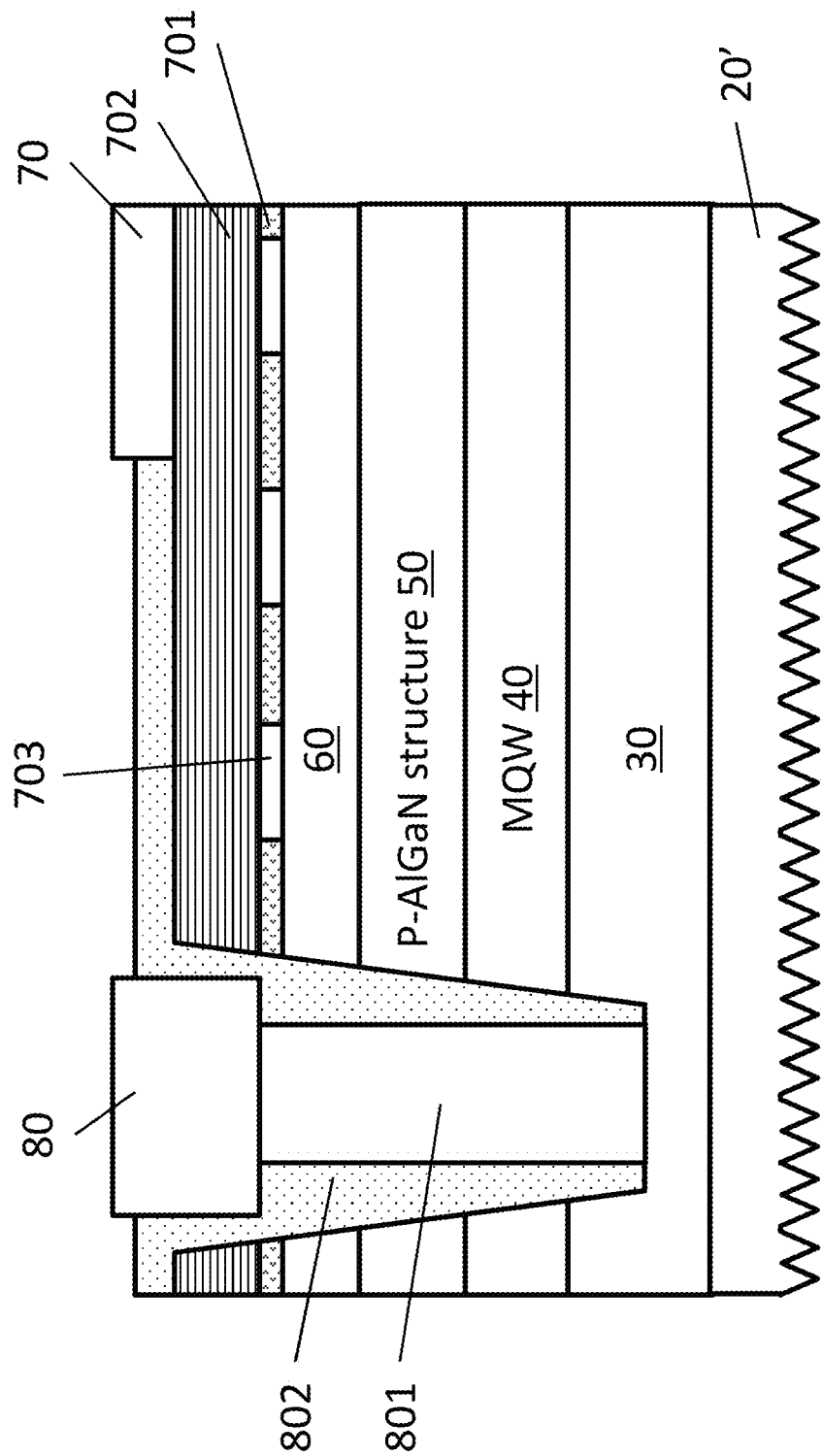
FIG. 7 illustrates the cross-sectional view of a UV LED according to an embodiment of the present invention.

The LED structure shown in FIG. 5 can be made into LED devices according to FIGS. 6A, 6B and 7. As seen from FIG. 6A, a mesa is etched out to expose N—AlGaN structure 30 and n-ohmic contact 801 made of a metal layer is formed on N—AlGaN structure 30. N-ohmic contact 801 can be made of very thin metal layer stacks such as titanium/aluminum/titanium/gold (Ti/Al/Ti/Au) with respective layer thickness of 30-40/70-80/10-20/80-100 nm, for example 35/75/15/90 nm. As seen from FIG. 6A, n-ohmic contact 801 is preferred to be formed on the heavily n-type doped N$^+$—AlGaN layer 33. Formed on n-ohmic contact 801 is n-contact pad 80 made of metal layer, which can be made of a thick (2-5 μm) gold layer. Formed over hole supplier and p-contact layer 60 is a p-ohmic contact 701. As explained previously, since the surface of layer 60 is of degenerate hole gas, high-work-function metals as well as low-work-function metals can be used to form p-ohmic contact 701. For example, contact 701 can be made of a thin Ni layer with a thickness of 2-20 nm, or a thin Pd layer (Pd can have UVC reflectivity as large as 40%) with a thickness of 2-20 nm, or a thin Pt layer with a thickness of 2-20 nm, or a thin Rh layer (Rh can have UVC reflectivity as large as 65%) with a thickness of 2-20 nm, or a thin W layer with a thickness of 2-20 nm, or a thin Os layer with a thickness of 2-20 nm, or any combination thereof.

Figure 6C:
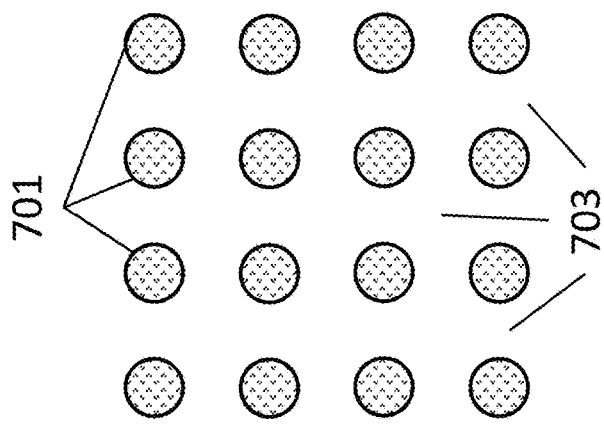
FIG. 6C illustrates two examples of in-plane arrangements of contact 701 and transparent dielectric layer 703.
Figure 6C:
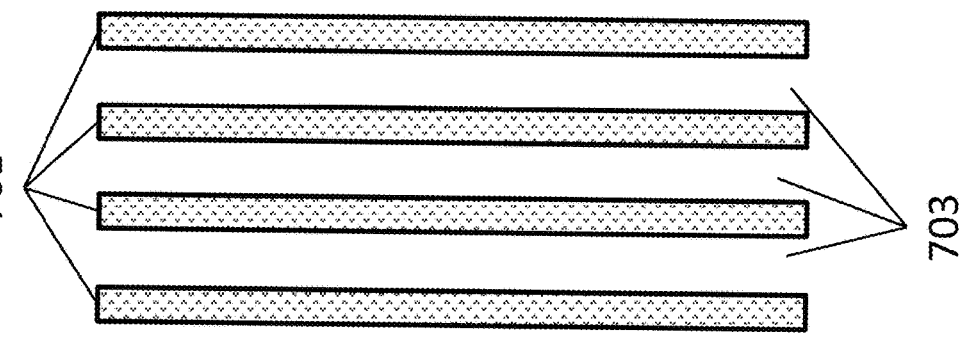

In some embodiments, contact 701 covers the full surface area of layer 60 as shown in FIG. 6A. In some other embodiments, contact 701 doesn't cover the full surface area of layer 60. As shown in FIGS. 6B and 6C, p-ohmic contact 701 covers partial surface area of layer 60, and a transparent dielectric layer 703 covers the rest surface area of layer 60. Contact 701 and transparent dielectric layer 703 form an interdigital or interconnected two-dimensional network, or contact 701 and transparent dielectric layer 703 can form a two-dimensional lattice structure. FIG. 6C illustrates two exemplary in-plane arrangements for contact 701 and transparent dielectric layer 703. In one embodiment, contact 701 and transparent dielectric layer 703 are of a strip shape and alternately arranged side-by-side. In another embodiment, isolated islands of contact 701 are surrounded by a continuous transparent dielectric layer 703. The arrangement of the surface a real ratio of contact 701 and transparent dielectric layer 703 is to optimize the device's wall-plug-efficiency, or equally, to optimize the product of the device's light extraction efficiency and the reciprocal of its operation voltage. Transparent dielectric layer 703 can be made of UV transparent low-refractive-index materials, such as air-gap, $SiO_2$, $AlF_3$, $CaF_2$, and $MgF_2$ et al. Specifically, an air gap is formed this way. First, an air-gap-to-be place is sealed with some organic solvent soluble material (denoted as 703'), such as photoresist. After the formation of UV reflector 702 on top of contact 701 and solvent soluble material 703', the soluble material is removed by organic solvents, forming air gaps surrounded by UV reflector 702, contact 701 and layer 60, as seen from FIG. 6B. UV reflector 702 formed on transparent dielectric layer 703 constructs an omnidirectional reflector with enhanced reflectivity for better UV light extraction. Transparent dielectric layer 703 may have the same thickness as p-ohmic contact 701, or may be thicker. For the optimal reflectivity, the thickness of transparent dielectric layer 703 is of the thickness equal or close to $$\frac{\lambda}{4n},$$

where λ is the wavelength of the light of interest, and n is the refractive index of the transparent dielectric layer 703 in which the light travels. Furthermore, transparent dielectric layer 703 can also be a multiple-transparent-dielectric-layer structure such as a UV distributed Bragg reflector (DBR).

Formed on p-ohmic contact 701 and transparent dielectric layer 703 is a UV reflector 702. In its simplest form, UV reflector 702 can be a thick Al layer, for example, an Al layer of a thickness 100-800 nm. Alternatively (though not explicitly shown in FIGS. 6A, 6B and 7), UV reflector 702 can be made of multiple-dielectric layers forming a UV distributed Bragg reflector (DBR) for enhanced UV reflectivity. When UV reflector 702 being a UV DBR, it may only be formed on transparent dielectric layer 703 and leave p-ohmic contact 701 accessible for electrical injection. Finally, p-contact pad 70, optionally made of gold, covers UV reflector 702 or p-ohmic contact 701 exposed by UV reflector 702.

Compared to conventional UV LEDs, the embodiments shown in FIGS. 6A and 6B are free of UV self-absorption. UV emissions traveling to p-side of the device will be reflected back by p-ohmic contact 701 and UV reflector 702 and be extracted from substrate 10, greatly enhancing UV light extraction efficiency (LEE). However, the embodiments shown in FIGS. 6A and 6B still have limitation in LEE, since the interfaces between substrate 10 and template 20, and between substrate 10 and air still have total internal reflection (TIR) due to large differences of refractive indexes therebetween.

Another embodiment is shown in FIG. 7, various layers and layer compositions in this embodiment are very similar to those shown in FIGS. 6A and 6B. The major difference is that in FIG. 7 substrate 10 is removed, and template 20 is roughen to become template 20'. Removing substrate 10 and roughening template 20 can get rid of total internal reflection. The embodiment shown in FIG. 7 thus has very high light extraction efficiency (LEE), promising an LEE up to 90%. Further, a UV transparent isolation layer 802 is utilized to prevent electrical short circuit. Isolation layer 802 can be made of UV transparent low-refractive-index materials, such as $SiO_2$, $AlF_3$, $CaF_2$, $MgF_2$, et al. Although FIG. 7 shows P and N contact pads are accessed from the same side of the quantum well, those skilled in the art should recognize that the N-ohmic contact can also be accessed from the side of the roughened template 20' when necessary.

In the following, some material/device characteristics of UVC LEDs using a transparent hole supplier and p-contact layer 60 according to the embodiment given in FIG. 5 will be presented, in parallel to those of a conventional UVC LED, to reveal the superiority of the UVC LEDs made according to the present invention.

A UVC LED wafer was made using Metal Organic Chemical Vapor Deposition (MOCVD) according to the embodiment shown in FIG. 5. A c-plane sapphire was used as substrate (10), with a 3.5 µm-thick AlN serving as AlN template 20. The N—AlGaN layer 31 is made of 2.5 µm-thick $Al_{0.58}Ga_{0.42}N$ doped with Si to a level of $2.5 \times 10^{18}$ $cm^{-3}$, and the $N^+$—AlGaN layer 33 and $N^-$—AlGaN layer 35 of the same composition to the N—AlGaN layer 31 are 200 nm and 100 nm thick and doped with Si to $8.5 \times 10^{18}$ $cm^{-3}$ and $3.5 \times 10^{17}$ $cm^{-3}$, respectively. The MQW 40 used was a five-pair multiple-quantum-well, with the barrier thickness and Al-composition to be 11.0 nm and 55%, and the well thickness and Al-composition to be 4.0 nm and 55%, respectively. Further the barriers were doped with Si at $3.0 \times 10^{18}$ $cm^{-3}$, and the wells were undoped. The EBL 51 used was an AlGaN/AlGaN multilayer structure, consisting of layers stack of 2 nm-$Al_{0.76}Ga_{0.24}N$/0.5 nm-$Al_{0.56}Ga_{0.44}N$/2 nm-$Al_{0.76}Ga_{0.24}N$/1.0 nm-$Al_{0.56}Ga_{0.44}N$/4 nm-$Al_{0.76}Ga_{0.24}N$/1.5 nm-$Al_{0.56}Ga_{0.44}N$/4 nm-$Al_{0.76}Ga_{0.24}N$/2.0 nm-$Al_{0.56}Ga_{0.44}N$/4 nm-$Al_{0.76}Ga_{0.24}N$/2.5 nm-$Al_{0.56}Ga_{0.44}N$/4 nm-$Al_{0.76}Ga_{0.24}N$/3.0 nm-$Al_{0.56}Ga_{0.44}N$/4 nm-$Al_{0.76}Ga_{0.24}N$/3.5 nm-$Al_{0.56}Ga_{0.44}N$/4 nm-$Al_{0.76}Ga_{0.24}N$, with sequence starting from the last barrier of the MQW. Following EBL 51 was a hole spreading structure 523 consisting of 5 pairs of channel 52 made of 0.5 nm GaN and barrier 53 made of 1.2 nm AlN. It is noted that EBL 51 and hole spreading structure 523 were all doped with Mg with the intentional doping level at $2.5 \times 10^{20}$ $cm^{-3}$. However, because of the surface segregation effect of Mg doping in group III nitride, the obtained Mg doping level could be different from the intended doping level. The real Mg-doping level at the beginning of the doping could be very small (mid $10^{18}$ $cm^{-3}$), and it could slowly ramp up to some larger value (mid $10^{19}$ $cm^{-3}$). Formed over hole spreading structure 523 was a 6 nm-thick heavily Mg doped AlN layer, serving as the transparent hole supplier and p-contact layer 60. For certain applications, it is of practical importance to have layer 60 with real Mg-concentration at or above $1.0 \times 10^{20}$ $cm^{-3}$. And in this sample, the Mg concentration in layer 60 was $2.0 \times 10^{20}$ $cm^{-3}$ as measured by doping profiling measurement.

Figure 8:
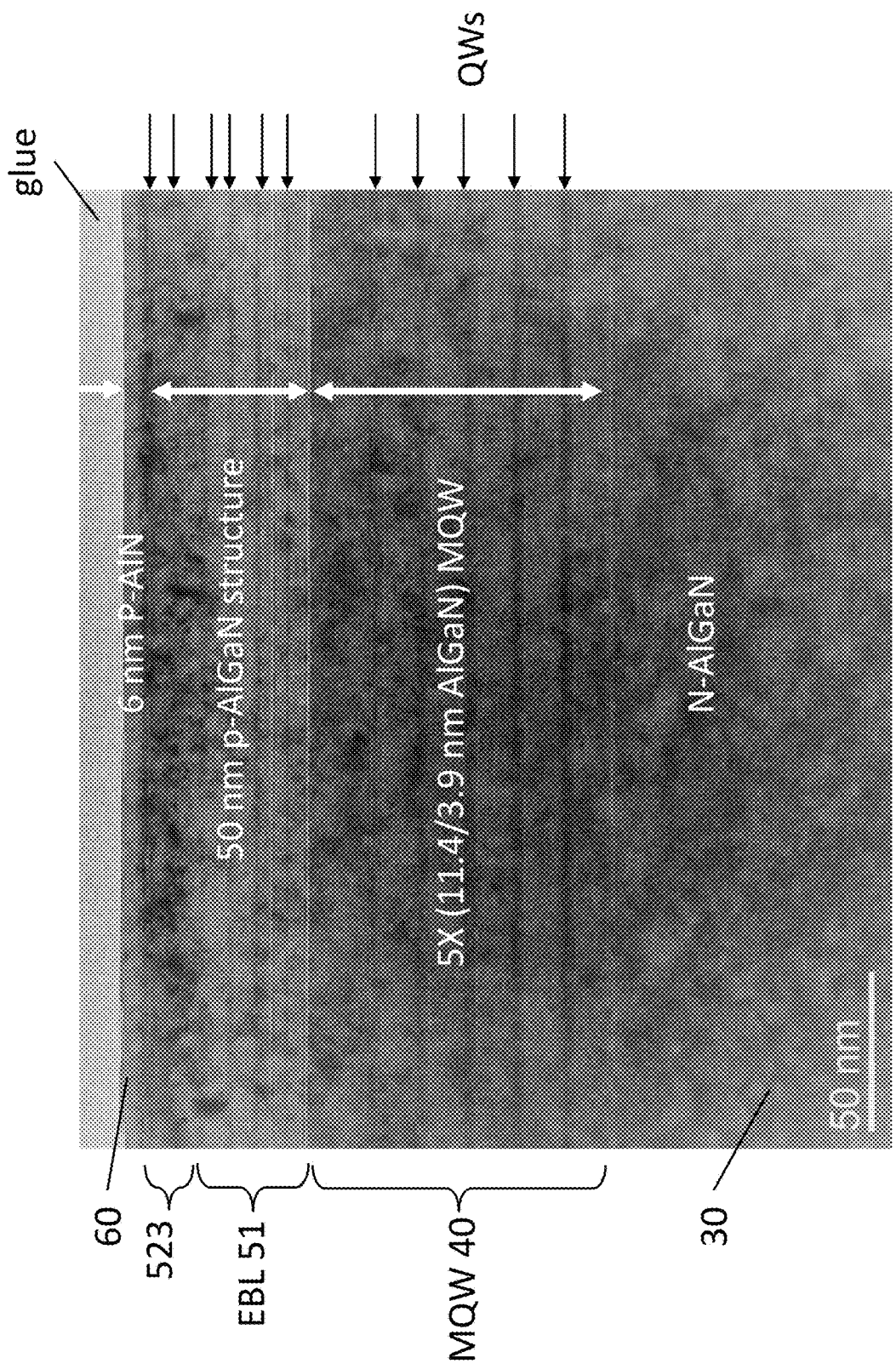
FIG. 8 plots the depth profiles of elements Al, Ga, N, C in the surface to multiple-quantum-well region of an UV LED according to an embodiment of the present invention.

The wafer was performed with a few material characterizations. A Transmission Electron Microscopic (TEM) image was taken at the surface vicinity of the wafer and shown in FIG. 8. As shown, formed over the thick N—AlGaN structure 30 are five-period MQW 40, with barrier/well thicknesses being 11.4 and 3.9 nm, respectively. EBL 51 formed over MQW 40 is an AlGaN multilayer structure, followed by hole spreading structure 523 (the TEM resolution was not able to distinguish channel 52 and barrier 53 because of their ultra-small thicknesses). The total thickness of the p-type AlGaN structure 50, including EBL 51 and hole spreading structure 523, sums up to 50 nm. Formed on hole spreading structure 523 is a heavily Mg-doped p-type AlN layer, serving as transparent hole supplier and p-contact layer 60, in this case with a thickness of 6 nm.

Figure 9:
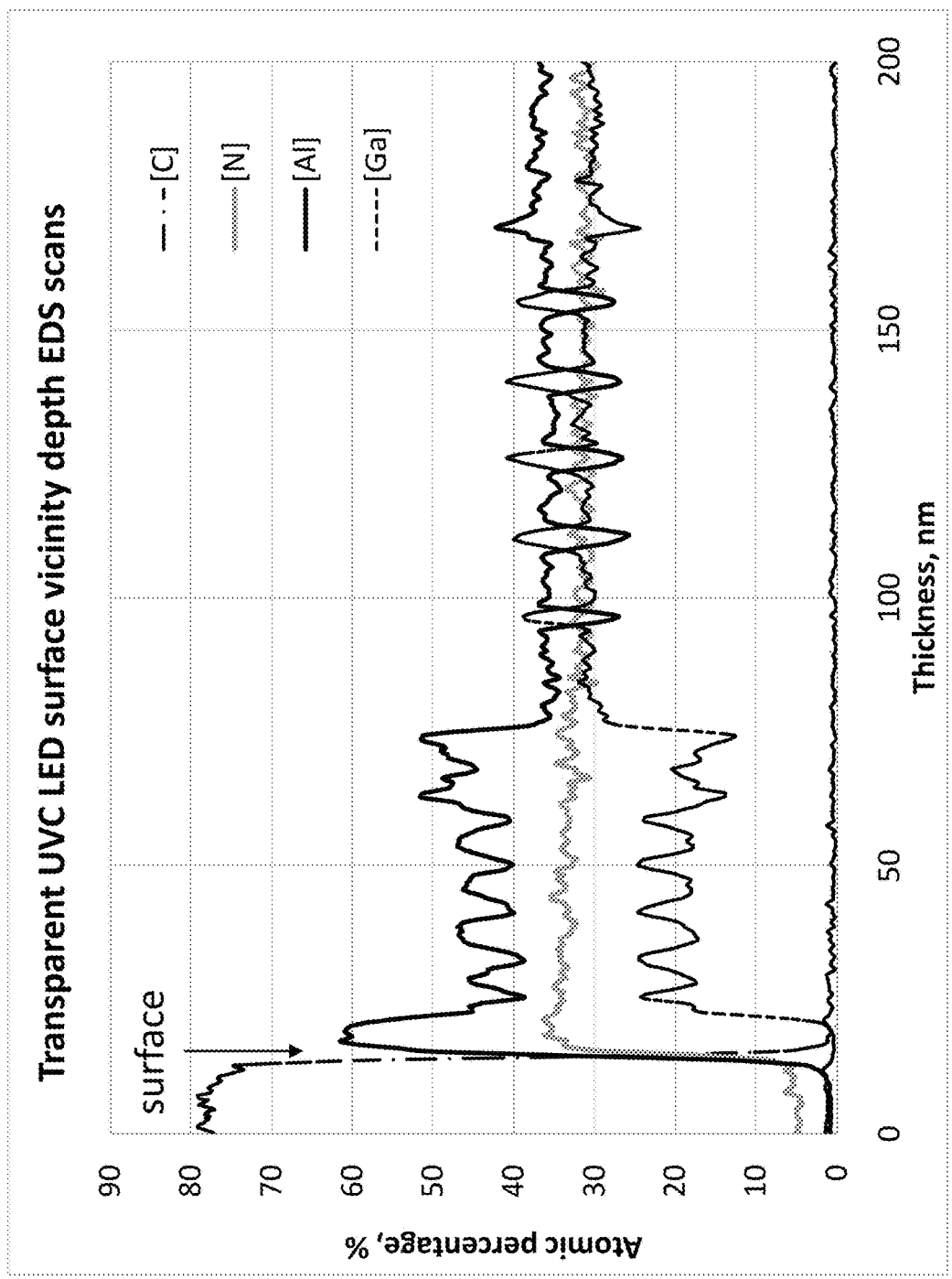
FIG. 9 shows a TEM image in the surface to multiple-quantum-well region of an UVC LED according to an embodiment of the present invention.

The composition depth profiles of different elements (C, Al, Ga, N) were also recorded during the TEM measurement, by Energy Dispersive Spectroscopy (EDS), and the results are plotted in FIG. 9. It is noted that EDS can only distinguish element with atomic percentage larger than 1%, so the dopant profiles such as those for Mg and Si are missing in FIG. 9. A strong carbon signal detected at the sample surface arose from conductive glue used in TEM sample preparation, and the carbon profile thus can be used to identify sample surface, as marked in FIG. 9. As seen, at the surface and subsurface down to a thickness of ~6 nm only Al and N signals were detected. This layer corresponded to the transparent hole supplier and p-contact layer 60. Beneath layer 60, Al, Ga, and N signals were all detected, with Al signal peaks corresponding to Ga signal valleys, or vice versa, revealing the multi-AlGaN-layer structures of p-AlGaN structure 50 and MQW 40.

Figure 10:
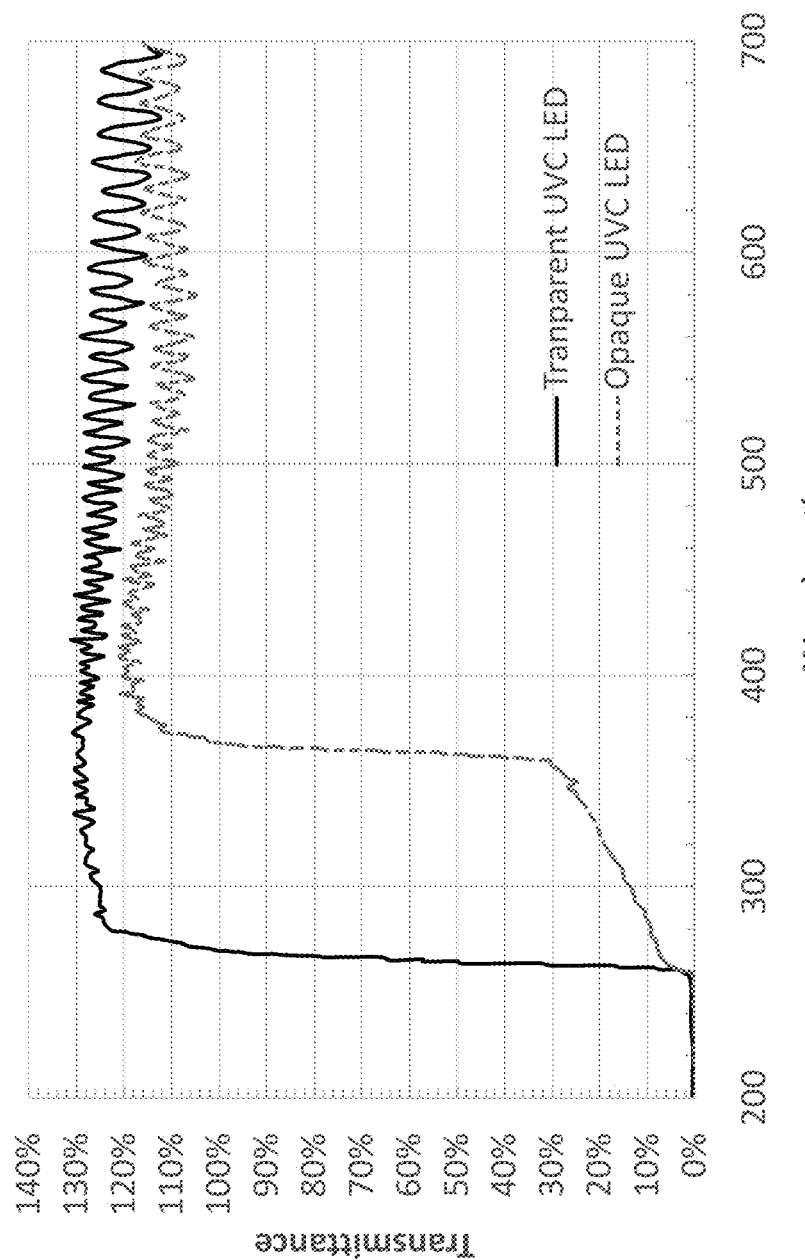
FIG. 10 plots UV-visible transmission spectra of a conventional opaque UVC LED and a transparent UVC LED according to an embodiment of the present invention.

The optical transmission spectrum was also recorded for the UVC LED wafer with transparent hole supplier and p-contact layer 60, as fabricated according to the embodiment shown in FIG. 5, and the transmission spectrum is presented in FIG. 10, marked as "transparent UVC LED", in comparison to the transmission spectrum (marked as "Opaque UVC LED") of a conventional UVC LED wafer, which used a 200 nm-thick p-GaN as p-contact layer. As seen, for the conventional UVC LED wafer there are two absorption cutoffs, one at ~365 nm corresponding to p-GaN's absorption edge, another at ~262 nm corresponding to N-AlGaN's absorption edge. The N—AlGaN (30) was used under the MQW (40) for electron supply and n-ohmic contact formation. Because p-GaN will absorb light with wavelengths less than 365 nm, the UVC light emitting from MQW of wavelengths in the range of 265-280 nm will be absorbed by p-GaN, severely limiting the conventional UVC LEDs' light extraction. In sharp contrast, the transparent UVC LED employing transparent hole supplier and p-contact layer 60 only has small absorption for the wavelengths between 265 to 280 nm, and virtually has no absorption for the wavelengths from 280 nm and above, greatly improving UVC LEDs' LEE.

Figure 11:
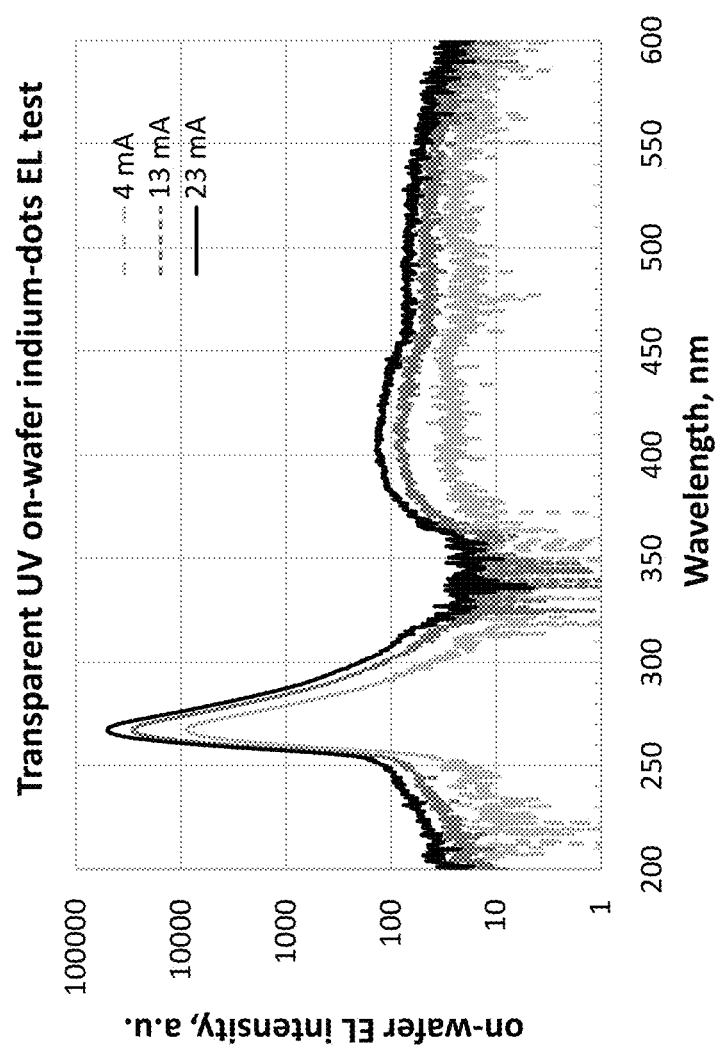
FIG. 11 plots on-wafer indium-dots-contact electroluminescence spectra curves of a transparent UVC LED according to an embodiment of the present invention.
Figure 12:
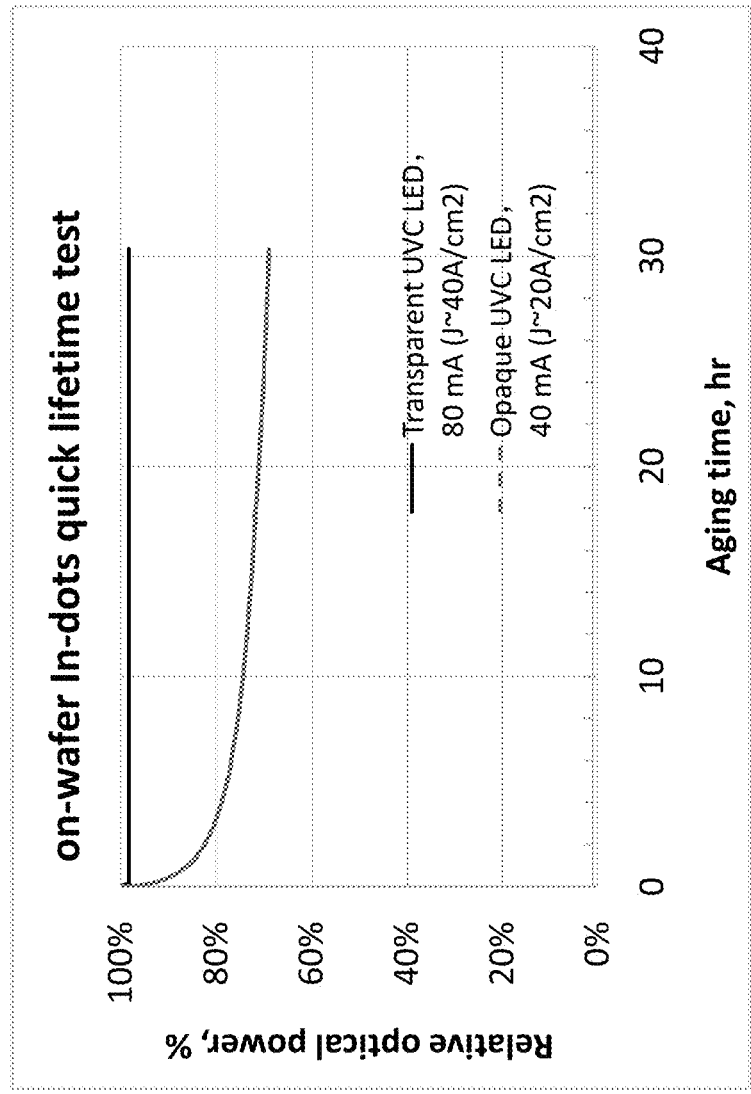
FIG. 12 compares the on-wafer indium-dots-contact optical power sustainability of a conventional opaque UVC LED and a transparent UVC LED according to an embodiment of the present invention.

The electrical and emission properties of the transparent UVC LED were assessed by a quick electroluminescence (QEL) measurement. For QEL measurement, an Indium (In)

dot of diameter of 0.5 mm was formed over wafer surface (layer 60) as p-contact, and a large area (~1 cm$^2$) of Indium film was soldered and spread to the wafer edge serving as n-contact. The EL spectra at different forward currents were plotted in FIG. 11, revealing clean and strong UVC emissions at 266 nm. It is noted that even though the In-dots contact is not UV reflective, the on-wafer In-dots tested UVC optical power from the transparent UVC LED wafer is more than 2 times of that from a conventional opaque UVC LED wafer. Further, the optical power from the transparent UVC LED is very stable even under 80 mA forward current (current density ~40 A/cm$^2$), as shown in FIG. 12. The optical power virtually stayed unchanged under 80 mA for more than 30 hours. On the contrary, the optical power from a conventional opaque UVC LED decays under on-wafer In-dots test, even with a smaller current at 40 mA (current density ~20 A/cm$^2$). The decay mechanism is speculated to be from the decay of p-GaN contact layer used in the conventional UVC LED, which is of inferior crystalline quality because of many dislocations arising from the large lattice mismatch (>1.1%) between p-AlGaN structure 50 and p-GaN contact layer.

Figure 13:
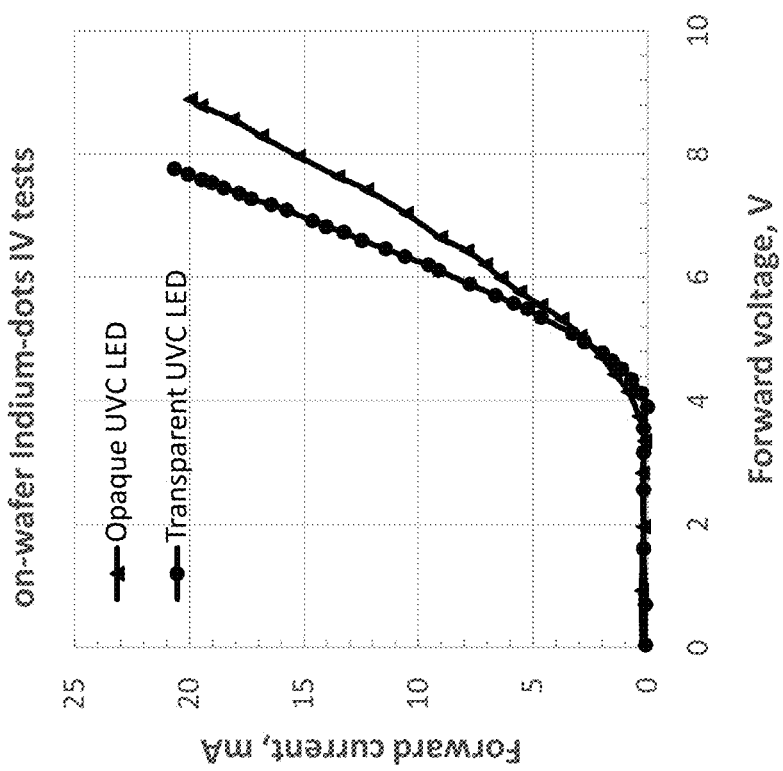
FIG. 13 plots on-wafer indium-dots-contact current-voltage curves of a conventional opaque UVC LED and a transparent UVC LED according to an embodiment of the present invention.

The on-wafer In-dots current-voltage characteristics were compared in FIG. 13 for a transparent UVC LED and a conventional UVC LED. As seen, a voltage of 7.6 V at 20 mA was measured for the transparent UVC LED, which is less than that voltage at 20 mA for a conventional UVC LED (8.9 V). This proves that the transparent hole supplier and p-contact layer 60 made according to the present invention is highly conducting and suitable for hole supplier and p-type contact formation. It is noted from our calibration that the voltage of a real LED with vacuum deposited and annealed ohmic contacts will be at least 2.5 volts less than that from a QEL In-dots test voltage.

Figure 14:
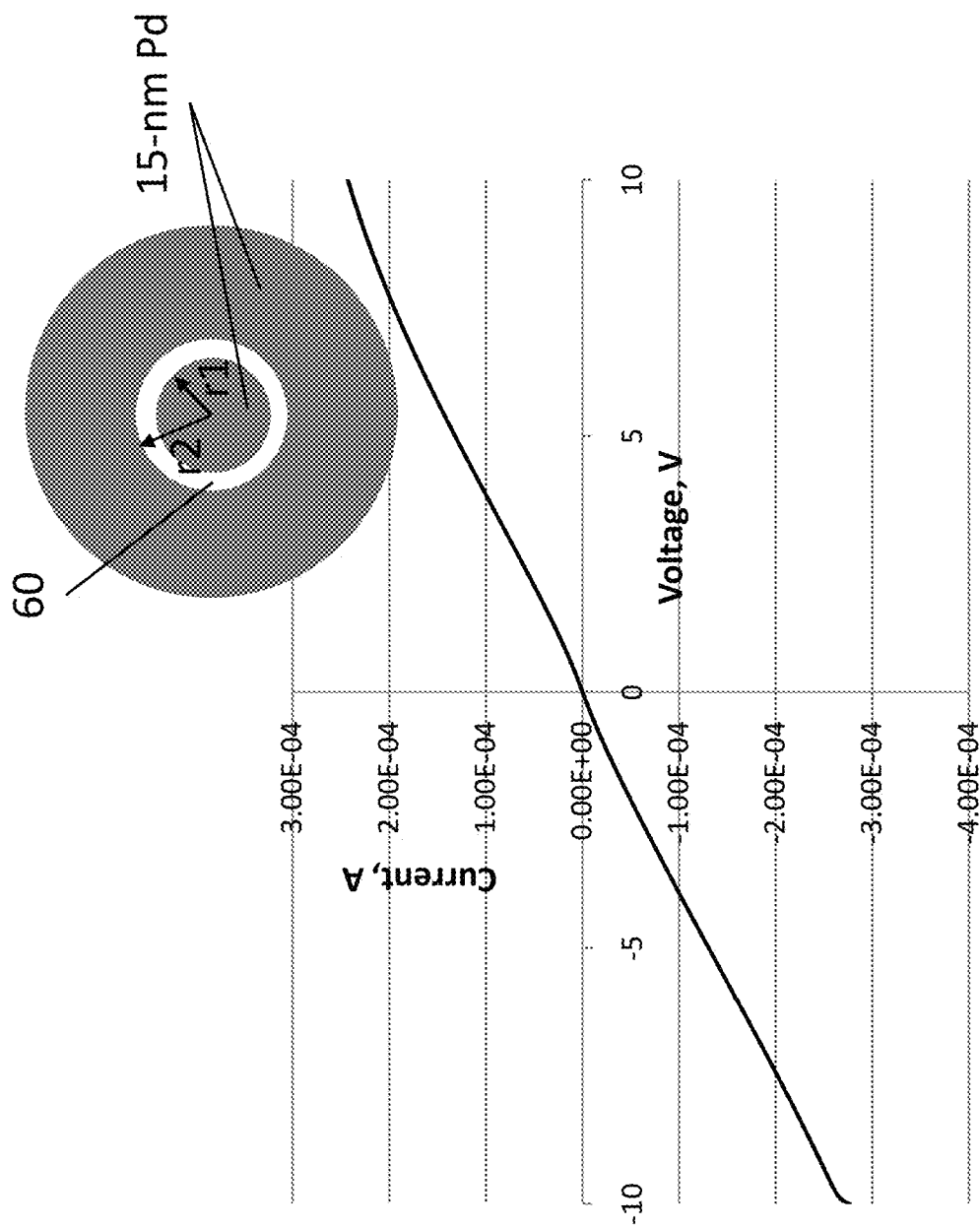
FIG. 14 plots the IV curve of as-deposited Pd-concentric circular contact pads formed on a heavily Mg-doped 1-nm-thick AlN layer made according to an embodiment of the present invention.

Direct measurement of layer 60's resistivity was also performed on a layer 60. For this measurement, the wafer structure was identical to that one described above with the exception that the top layer 60 was made of a heavily Mg-doped (2.0×10$^{20}$ cm$^{-3}$) AlN of 1 nm-thick, instead of 6 nm-thick. As shown in FIG. 14, a 15 nm-thick Pd metal layer was deposited on the layer 60, forming concentric circular contact pads, with the radius of the inner contact pad being r1=100 μm and the circular gap separation being 10 μm (i.e., r2=110 μm). The contact pads were as deposited without any post annealing. Also shown in FIG. 14 is the current-voltage (IV) characteristic curve measured via biasing the two concentric circular contact pads. As seen, metal Pd as-deposited forms good ohmic contact to the layer 60, referred from the linear IV curve. Since Pd has a work function of ~5.2 eV, it is speculated that any metal of work function larger than 5.2 eV will form ohmic contact to hole supplier and p-contact layer 60 without post-deposition annealing. These metals include Pd (Palladium), Pt (Platinum), and Os (Osmium) et al.

The resistivity (ρ) of the layer 60 is estimated as follows.

The voltage drop between the two pads, $V_{12}$ relates to conductivity (σ) and electric field (E) via equation:

$$V_{12} = \int_{r1}^{r2} E\,dr = \int_{r1}^{r2} \frac{j}{\sigma}\,dr = \int_{r1}^{r2} \frac{I}{2\pi r \sigma t}\,dr,$$

where j, I and t are current density, current and thickness of layer 60, respectively. Since the IV curve is rather linear, and the voltage at 0.2 mA is 7.8 V, the calculated resistivity is ρ=(1/σ)=0.257 Ωcm. This calculation overestimates the resistivity of layer 60 since the metal-semiconductor contact resistivity was also included as the bulk resistivity of the layer 60. In any event, the resistivity of 0.257 Ωcm is already very small. If assuming the hole's mobility being 4 cm$^2$/v.s, the hole concentration is 6.0×10$^{18}$ cm$^{-3}$. For reference, the regular p-type GaN is of resistivity around 1.0 Ωcm.

Figure 15:
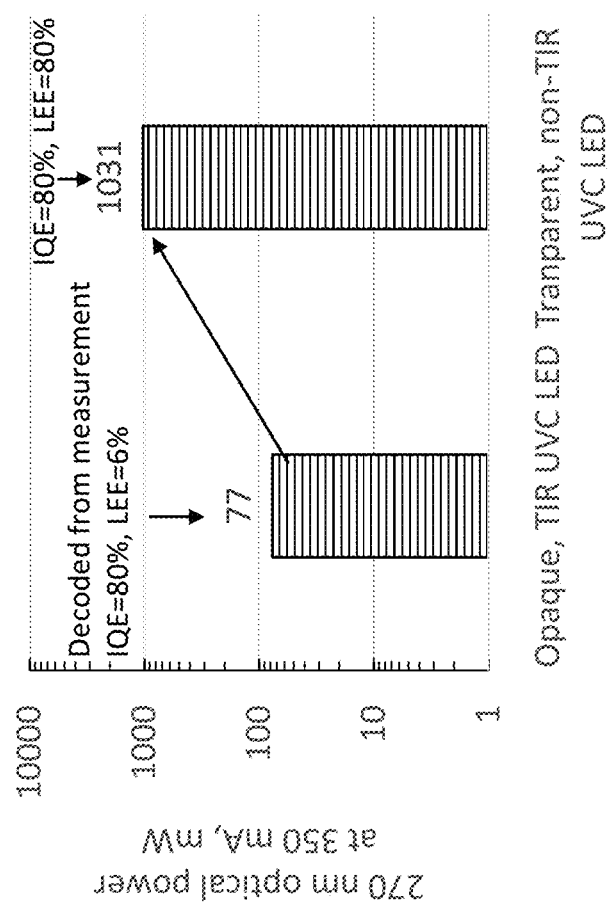
FIG. 15 compares UV optical power values of two different architected UVC LEDs according to embodiments of the present invention.

FIG. 15 compares UV optical power values of two different architected UV LEDs according to embodiments of the present invention. As seen, the measured power from one of our fully packaged (without lens) conventional opaque UVC LED was 77 mW at 350 mA. And its internal quantum efficiency (IQE) and LEE were decoded by simulating the efficiency curve to be 80% and 6% at 350 mA (J~40 A/cm$^2$), respectively. Taking the IQE of 80% from the conventional UVC LED, the transparent UVC LEDs using the architecture shown in FIG. 7 can have expectant LEE not less than 80% thus promise to deliver UVC optical power not less than 1031 mW at 350 mA.

In summary, the QEL on-wafer test indicated that the UVC LEDs according to the present invention incorporated with transparent hole supplier & p-contact layer 60 have much higher light output and external quantum efficiency, as well as superior current-voltage characteristics and device reliability.

The present invention has used UV LEDs as exemplary embodiments. It is noted that the transparent hole supplier and p-contact layer 60 can also be used for other optical devices, such as laser diodes and photodetectors. In the cases of laser diodes and photodetectors, as well as LEDs, the application of layer 60 can greatly improve these optical devices' external quantum efficiency, owing to the absence of the UV absorbing p-type layers (p-GaN, p-InGaN, and low-Al-content p-AlGaN).

The above described layer 60 also can be applied in a photodetector such as a UV photodetector. The major difference of a photodetector and an LED lies in their active-regions. The active-region of an LED is commonly made of MQW for confining electrons and holes for enhanced radiative recombination rate, whereas the active-region of a photodetector is a light absorbing thick semiconductor layer, used to generate photon-induced electrons and holes, which are separated by a reversed bias to the PN junction to generate photocurrent for photon detection.

Figure 16:
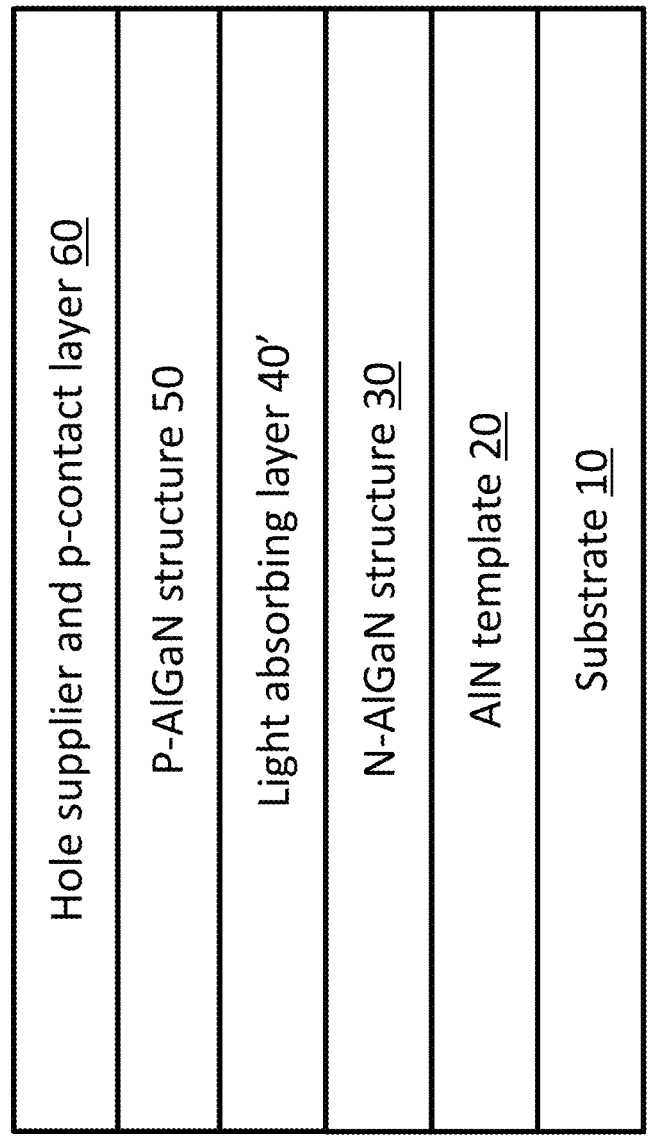
FIG. 16 illustrates a UV photodetector epitaxial layer structure according to an embodiment of the present invention.

Illustrated in FIG. 16 is a schematic layer structure of a photodetector using transparent hole supplier and p-contact layer 60 according to an embodiment of the present invention. As seen, the photodetector can be formed over a high-quality template or window layer 20, which in turn can be formed on a substrate 10. For solar blind applications, substrate 10 can be a sapphire or AlN wafer and template layer 20 can be an AlN layer or AlGaN layer with Al-composition higher enough to assuring UV light transparency to the light absorbing layer 40' (photodetector's active-region), which can be made of intrinsic AlGaN with a thickness of 100-500 nm, such as 200-300 nm. The thickness of light absorbing layer 40' is arranged so that enough photons are absorbed and photocurrent is generated. In practice, the Al-composition of window layer 20 can be at least 20%, or 30%, or 50% more than that of the light absorbing layer 40'. For example, the Al-composition of window layer 20 can be in the range of 0.6-1.0, while the Al-composition of light absorbing layer 40' is 0.46 for 280 nm and shorter wavelength detection. N—AlGaN structure 30 can be a Si-doped AlGaN layer transparent to the targeted detection wavelength with an Al-composition in the range of 0.5-0.7. For solar blind detection of 280 nm and shorter wavelengths, the targeted Al-composition of the intrinsic AlGaN material for light absorbing layer 40' is not less than 0.46 (here calculated by assuming GaN and AlN bandgap energy to be respectively 3.42 and 6.2 eV, and bowing parameter for AlGaN bandgap energy to be −1), for example, 0.46 to 1.0, or 0.47 to 0.55. Formed on light absorbing layer 40' is a p-AlGaN structure 50, which can be a p-type AlGaN layer with Al-composition larger than or equal to that of N—AlGaN structure 30. N—AlGaN structure 30 and p-AlGaN structure 50 can also be the same or similar to their counterparts found in a UV LED structure such as shown in FIG. 5. Formed over p-AlGaN structure 50 is a hole supplier and p-contact layer 60 made according to previously described embodiments of the present invention. Even though not shown in FIG. 16, a reflective p-contact can be made on layer 60, similar to those shown in UV LED embodiments (FIGS. 6A, 6B and 7). The application of hole supplier and p-contact layer 60 and the reflective p-contact allows photons to have increased absorption probability in light absorbing layer 40', leading to increased photon responsivity and external quantum efficiency.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A hole supplier and p-contact structure for a light emitting device or a photodetector, comprising:
   a p-type group III nitride structure; and
   a hole supplier and p-contact layer made of Al-containing group III nitride formed on the p-type group III nitride structure and being under a biaxial in-plane tensile strain,
   wherein the hole supplier and p-contact layer has a thickness in the range of 0.6-10 nm, a room-temperature acceptor activation ratio of the hole supplier and p-contact layer is larger than 1%, and the p-type group III nitride structure is formed over an active region of the light emitting device or photodetector.

2. The hole supplier and p-contact structure according to claim 1, wherein an acceptor activation energy of the hole supplier and p-contact layer is in the range of 0.1 to 0.5 eV, and a polarization induced electric field in the hole supplier and p-contact layer is in the range of $3 \times 10^5$ V/cm to $3 \times 10^7$ V/cm.

3. The hole supplier and p-contact structure according to claim 1, wherein the hole supplier and p-contact layer is made of $Al_xGa_{1-x}N$ with $0.7 \le x \le 1$.

4. The hole supplier and p-contact structure according to claim 1, wherein the hole supplier and p-contact layer is made of AlN and coherently formed on the p-type group III nitride structure.

5. The hole supplier and p-contact structure according to claim 1, wherein the hole supplier and p-contact layer has an Al-composition higher than that of the p-type group III nitride structure.

6. The hole supplier and p-contact structure according to claim 1, wherein the hole supplier and p-contact layer is doped with Mg in a concentration of $1.0 \times 10^{20}$ cm$^{-3}$ to $1.0 \times 10^{21}$ cm$^{-3}$.

7. The hole supplier and p-contact structure according to claim 1, wherein the hole supplier and p-contact layer can form an ohmic contact with a low-work-function metal.

8. The hole supplier and p-contact structure according to claim 1, wherein the light emitting device is a light emitting diode, or a laser diode.

9. The hole supplier and p-contact structure according to claim 1, wherein the hole supplier and p-contact layer is made of AlN and coherently formed on the p-type group III nitride structure.

10. A light emitting diode comprising:
    an n-type AlGaN structure;
    a p-type AlGaN structure;
    a multiple quantum well active-region sandwiched between the n-type AlGaN structure and the p-type AlGaN structure; and
    a hole supplier and p-contact layer made of c-plane $Al_xGa_{1-x}N$ with $0.7 \le x \le 1$ and formed on the p-type AlGaN structure,
    wherein the hole supplier and p-contact a layer has a higher Al-composition than that of the p-type AlGaN structure, the multiple quantum well active-region, and the n-type AlGaN structure, and is of a thickness from 0.6 nm to 10 nm.

11. The light emitting diode according to claim 10, wherein the hole supplier and p-contact layer is doped with Mg in a concentration of $1.0 \times 10^{20}$ cm$^{-3}$ to $1.0 \times 10^{21}$ cm$^{-3}$.

12. The light emitting diode according to claim 10, wherein the p-type AlGaN structure comprises:
    a hole injecting and electron blocking layer in contact with the multiple quantum well active-region;
    a first channel layer formed on the hole injecting and electron blocking layer;
    a p-type barrier formed on first channel layer; and
    a second channel layer formed on p-type barrier,
    wherein the hole supplier and p-contact layer is formed on the second channel layer.

13. The light emitting diode according to claim 12, wherein the first and second channel layers are made of p-type $Al_yGa_{1-y}N$ with $0 \le y \le 0.1$, respectively, and is of a thickness in the range of 0.5-1.5 nm, respectively.

14. The light emitting diode according to claim 12, wherein the p-type barrier is made of p-type AlN and is of a thickness in the range of 1-3 nm.

15. The light emitting diode according to claim 12, wherein the p-type AlGaN structure comprises multiple pairs of the p-type barrier and the first channel layer alternately stacked.

16. The light emitting diode according to claim 12, wherein the hole injecting and electron blocking layer is a p-type AlGaN layer, or a p-type AlGaN superlattice structure, or a p-type multilayer structure.

17. The light emitting diode according to claim 10, further comprising a p-ohmic contact formed on the hole supplier and p-contact layer which forms ohmic contact with the hole supplier and p-contact layer.

18. The light emitting diode according to claim 17, wherein the p-ohmic contact is made of a metal selected from Pd, Pt, Rh, and Os.

19. The light emitting diode according to claim 17, further comprising a transparent dielectric layer formed on the hole supplier and p-contact layer side-by-side with the p-ohmic contact.

20. A UV photodetector comprising:
    an n-type AlGaN structure;
    a p-type AlGaN structure;

a light absorbing layer sandwiched between the n-type AlGaN structure and the p-type AlGaN structure; and a hole supplier and p-contact layer made of Al-containing group III nitride formed on the p-type AlGaN structure, wherein the hole supplier and p-contact layer is made of $Al_xGa_{1-x}N$ with $0.7 \leq x \leq 1$ and has a thickness from 0.6 nm to 10 nm.

21. A hole supplier and p-contact structure for a light emitting device or a photodetector, comprising:
    a p-type group III nitride structure; and
    a hole supplier and p-contact layer made of Al-containing group III nitride formed on the p-type group III nitride structure and being under a biaxial in-plane tensile strain,
    wherein the hole supplier and p-contact layer has a thickness in the range of 0.6-10 nm, an acceptor activation energy of the hole supplier and p-contact layer is in the range of 0.1 to 0.5 eV, and a polarization induced electric field in the hole supplier and p-contact layer is in the range of $3 \times 10^5$ V/cm to $3 \times 10^7$ V/cm, and the p-type group III nitride structure is formed over an active region of the light emitting device or photodetector.

22. The hole supplier and p-contact structure according to claim 21, wherein the hole supplier and p-contact layer is made of $Al_xGa_{1-x}N$ with $0.7 \leq x \leq 1$.

23. A hole supplier and p-contact structure for a light emitting device or a photodetector, comprising:
    a p-type group III nitride structure; and
    a hole supplier and p-contact layer made of $Al_xGa_{1-x}N$ with $0.7 \leq x \leq 1$ formed on the p-type group III nitride structure and being under a biaxial in-plane tensile strain,
    wherein the hole supplier and p-contact layer has a thickness in the range of 0.6-10 nm, and the p-type group III nitride structure is formed over an active region of the light emitting device or photodetector.

24. A light emitting diode comprising:
    an n-type AlGaN structure;
    a p-type AlGaN structure;
    a multiple quantum well active-region sandwiched between the n-type AlGaN structure and the p-type AlGaN structure; and
    a hole supplier and p-contact layer made of Al-containing group III nitride and formed on the p-type AlGaN structure,
    wherein the hole supplier and p-contact layer has a higher Al-composition than that of the p-type AlGaN structure, the multiple quantum well active-region, and the n-type AlGaN structure, and is of a thickness from 0.6 nm to 10 nm,
    wherein the p-type AlGaN structure comprises:
    a hole injecting and electron blocking layer in contact with the multiple quantum well active-region;
    a first channel layer formed on the hole injecting and electron blocking layer;
    a p-type barrier formed on first channel layer; and
    a second channel layer formed on p-type barrier, wherein the hole supplier and p-contact layer is formed on the second channel layer.

25. The light emitting diode according to claim 24, wherein the first and second channel layers are made of p-type $Al_yGa_{1-y}N$ with $0 \leq y \leq 0.1$, respectively, and is of a thickness in the range of 0.5-1.5 nm, respectively.

26. The light emitting diode according to claim 24, wherein the p-type barrier is made of p-type AlN and is of a thickness in the range of 1-3 nm.

27. A light emitting diode comprising:
    an n-type AlGaN structure;
    a p-type AlGaN structure;
    a multiple quantum well active-region sandwiched between the n-type AlGaN structure and the p-type AlGaN structure;
    a hole supplier and p-contact layer made of Al-containing group III nitride and formed on the p-type AlGaN structure, wherein the hole supplier and p-contact layer has a higher Al-composition than that of the p-type AlGaN structure, the multiple quantum well active-region, and the n-type AlGaN structure, and is of a thickness from 0.6 nm to 10 nm;
    a p-ohmic contact formed on the hole supplier and p-contact layer which forms ohmic contact with the hole supplier and p-contact layer; and
    a transparent dielectric layer formed on the hole supplier and p-contact layer side-by-side with the p-ohmic contact.

* * * * *